(12) United States Patent
Sharma et al.

(10) Patent No.: US 10,955,493 B2
(45) Date of Patent: Mar. 23, 2021

(54) MAGNETIC SENSOR SYSTEMS

(71) Applicant: Analog Devices Global Unlimited Company, Hamilton (BM)

(72) Inventors: Yogesh Jayaraman Sharma, Santa Clara, CA (US); Jochen Schmitt, Biedenkopf (DE); Paul R. Blanchard, Westford, MA (US)

(73) Assignee: ANALOG DEVICES GLOBAL UNLIMITED COMPANY, Hamilton (BM)

( * ) Notice: Subject to any disclaimer, the term of this patent is extended or adjusted under 35 U.S.C. 154(b) by 232 days.

(21) Appl. No.: 16/294,192

(22) Filed: Mar. 6, 2019

(65) Prior Publication Data

US 2019/0339337 A1 Nov. 7, 2019

Related U.S. Application Data

(60) Provisional application No. 62/665,985, filed on May 2, 2018.

(51) Int. Cl.
*G01R 33/00* (2006.01)
*G01R 35/00* (2006.01)
(Continued)

(52) U.S. Cl.
CPC ..... *G01R 33/0035* (2013.01); *G01R 33/0017* (2013.01); *G01R 33/07* (2013.01); *G01R 33/098* (2013.01); *G01R 35/005* (2013.01)

(58) Field of Classification Search
CPC ............ G01R 33/0017; G01R 33/0007; G01R 33/0005
See application file for complete search history.

(56) References Cited

U.S. PATENT DOCUMENTS 6,335,617 B1 1/2002 Osadchy et al.
6,731,105 B1 5/2004 Hoyle et al.
(Continued)

FOREIGN PATENT DOCUMENTS

CN 105182258 12/2015
CN 107300683 10/2017
(Continued)

OTHER PUBLICATIONS

Renaudin et al., *Complete Triaxis Magnetometer Calibration in the Magnetic Domain*, Journal of Sensors, vol. 2010, Article ID 967245, 10 pages.

(Continued)

*Primary Examiner* — Alvaro E Fortich
(74) *Attorney, Agent, or Firm* — Patent Capital Group

(57) ABSTRACT

A calibration apparatus for calibrating a magnetic sensor configured to generate an output signal indicative of magnetic field strength when a bias signal is applied to it is disclosed. The apparatus includes a test magnetic field generator (MFG) to generate magnetic fields of known magnitude, and further includes a processor to control the MFG to generate a known magnetic field, control the sensor to generate a test output signal when the MFG generates the known magnetic field and a known bias signal is applied to the sensor, and determine how to change the bias signal based on a deviation of the measured test output signal from an expected output signal. Using a test MFG that produces known magnetic fields when known bias signals are applied to sensors allows evaluating and compensating for changes in sensitivity of the sensors by accordingly changing bias signals applied to the sensors.

25 Claims, 13 Drawing Sheets

(51) Int. Cl.
*G01R 33/09* (2006.01)
*G01R 33/07* (2006.01)

(56) References Cited

U.S. PATENT DOCUMENTS

| | | | |
|---|---|---|---|
| 6,750,644 | B1 | 6/2004 | Berkcan |
| 7,345,470 | B2 | 3/2008 | Suzuki |
| 7,835,879 | B2 | 11/2010 | Vocali et al. |
| 7,923,987 | B2 | 4/2011 | Ausserlechner |
| 8,076,927 | B2 | 12/2011 | Ausserlechner et al. |
| 8,134,358 | B2 | 3/2012 | Charlier et al. |
| 8,818,747 | B2 | 8/2014 | Weiss et al. |
| 9,151,807 | B2 | 10/2015 | Friedrich et al. |
| 9,201,122 | B2 | 12/2015 | Cesaretti et al. |
| 9,645,220 | B2 | 5/2017 | Cesaretti et al. |
| 9,671,484 | B2 | 6/2017 | Youm et al. |
| 9,678,169 | B2 | 6/2017 | Chen et al. |
| 9,720,051 | B2 | 8/2017 | Holm et al. |
| 9,739,846 | B2 | 8/2017 | Petrie et al. |
| 9,817,078 | B2 | 11/2017 | Pepka et al. |
| 9,841,485 | B2 | 12/2017 | Petrie et al. |
| 9,851,416 | B2 | 12/2017 | Scheller et al. |
| 2009/0072815 | A1* | 3/2009 | Kahlman ............... B82Y 25/00 324/202 |
| 2010/0117638 | A1 | 5/2010 | Yamashita et al. |
| 2011/0169488 | A1 | 7/2011 | Mather |
| 2012/0016614 | A1 | 1/2012 | Hohe et al. |
| 2012/0133356 | A1 | 5/2012 | Charlier et al. |
| 2012/0274314 | A1 | 11/2012 | Cesaretti et al. |
| 2013/0162245 | A1 | 6/2013 | Tamura |
| 2015/0346290 | A1* | 12/2015 | Holm ..................... G01R 33/09 324/202 |
| 2016/0047846 | A1* | 2/2016 | Sharma ................ G01R 15/205 324/251 |
| 2016/0313413 | A1 | 10/2016 | Mohan et al. |
| 2016/0320462 | A1 | 11/2016 | Mather et al. |
| 2017/0115360 | A1 | 4/2017 | Jiang et al. |
| 2017/0176546 | A1 | 6/2017 | Jain et al. |
| 2017/0184635 | A1 | 6/2017 | Ugge et al. |
| 2018/0372810 | A1 | 12/2018 | Jiang et al. |

FOREIGN PATENT DOCUMENTS

| | | |
|---|---|---|
| CN | 107305241 | 10/2017 |
| EP | 2446287 | 5/2012 |
| EP | 3203254 | 8/2017 |
| JP | 3681483 B2 | 8/2005 |
| JP | 2013186053 | 9/2013 |
| WO | 2001/015108 | 3/2001 |
| WO | 2001/015105 | 3/2011 |
| WO | 2004/025225 | 3/2014 |

OTHER PUBLICATIONS

Markevicius et al., *Adaptive Thermo-Compensation of Magneto-Resistive Sensor*, Electronics and Electrical Engineering, ISSN 1392-1215, 2011, No. 8(114), 4 pages.

Ouyang et al., *A Current Sensor Based on the Giant Magnetoresistence Effect: Design and Potential Smart Grid Applications*, Sensors 2012, 12, 15520-15541; doi:10.3390/s121115520, www.mdpi.com/journal/sensors, 22 pages.

Jogschies et al., *Recent Developments of Magnetoresistive Sensors for Industrial Applications*, Sensors 2015, 15, 28665-28689; doi:10.3390/s151128665, www.mdpi.com/journal/sensors, 25 pages.

Sešek et al., *Temperature Compensation of Magnetic Sensor Sensitivity Maintaining Ratiometric Output*, Conference Paper, Oct. 2014, University of Ljubljana, 6 pages.

International Search Report and Written Opinion issued in International Patent Application Serial No. PCT/2018/080684 dated Feb. 22, 2019, 20 pages.

Machine Translation of JP3681483B2.

* cited by examiner

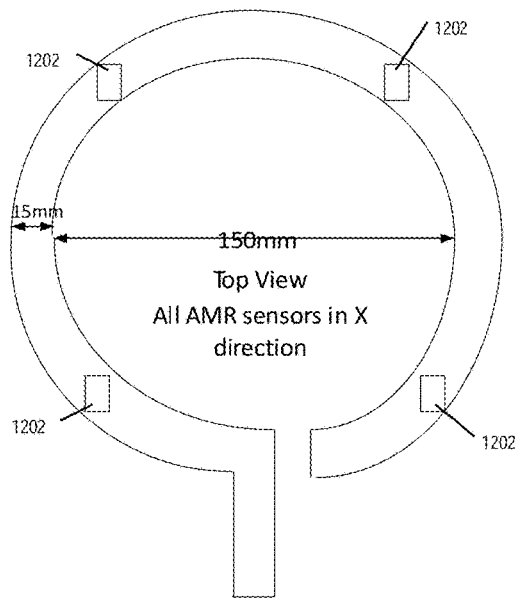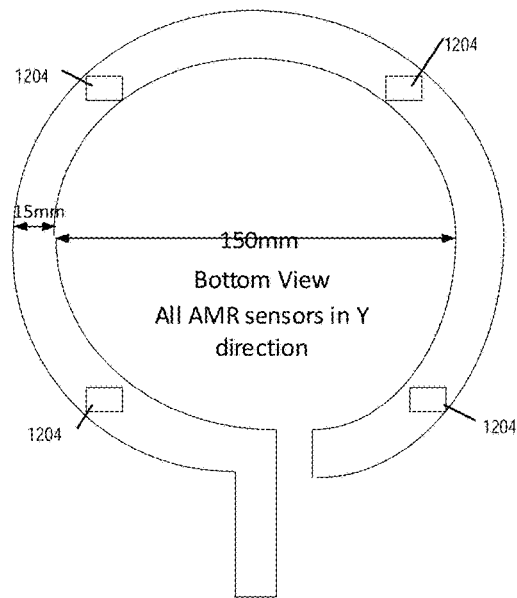
FIG. 10A
FIG. 10B

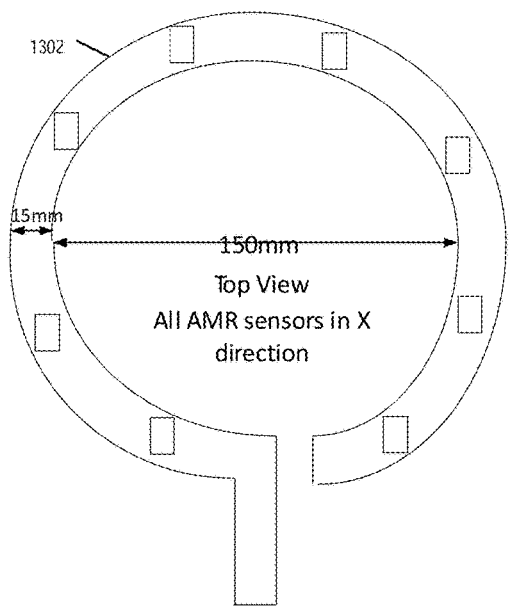 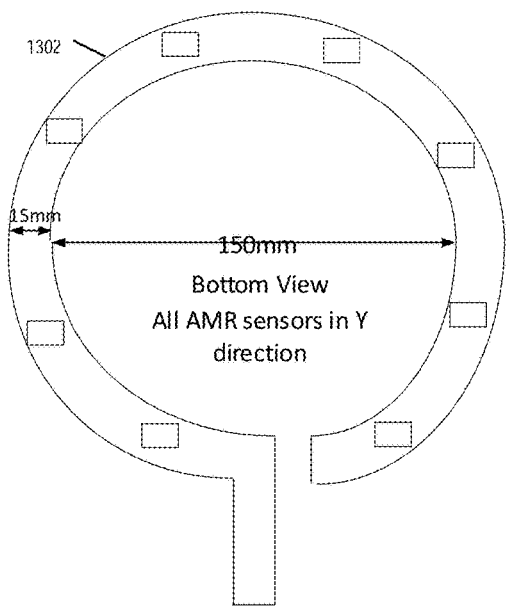
FIG. 11A
FIG. 11B

MAGNETIC SENSOR SYSTEMS

CROSS REFERENCE TO RELATED APPLICATIONS

This application is related to U.S. Patent Application No. 62/665,985, filed May 2, 2018, titled "CURRENT MEASUREMENT SYSTEMS," the disclosure of which is hereby incorporated by reference herein in its entirety.

TECHNICAL FIELD OF THE DISCLOSURE

The present disclosure generally relates to systems that employ magnetic sensors and, more particularly, to calibration of magnetic sensors and placement of magnetic sensors in a housing.

BACKGROUND

Magnetic sensors, such as magnetoresistive (MR) sensors, can be used for magnetic field sensing in a wide range of industrial, automotive, and healthcare applications. For example, magnetic sensors can be configured in a Wheatstone bridge and the output voltage of the sensors can be proportional to an external magnetic field sensed with respect to the internal magnetization of the sensors. In certain instances, such sensors may have a signal-to-noise ratio (SNR) close to 100 dB making them attractive for high-precision applications, and for low-power and size-limited applications.

One example application of magnetic sensors is for current measurement apparatuses where magnetic sensors may be used to perform measurement of currents through conductor wires without coming into contact or breaking the wires (i.e., in a contactless manner). Such contactless current measurement may be useful for diagnostic, operational, and protection purposes in many settings, such as residential, industrial, and automotive.

One of the challenges with using conventional magnetic sensors for magnetic field sensing is the variation of sensitivity of the sensors with external magnetic field and/or temperature. Another challenge is that conventional housing structures in which magnetic sensors are typically provided may not always fit inside tight places or other constrained areas where measurements may need to be carried out. Improvements on one or more of these challenges would be desirable.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIGS. 10A and 10B illustrate example placement of sensors within an example apparatus for measuring current, according to some embodiments of the present disclosure;

FIGS. 11A and 11B illustrate example placement of sensors within an alternative example apparatus for measuring current, according to some embodiments of the present disclosure.

DESCRIPTION OF EXAMPLE EMBODIMENTS OF THE DISCLOSURE

Overview

Figure 1:
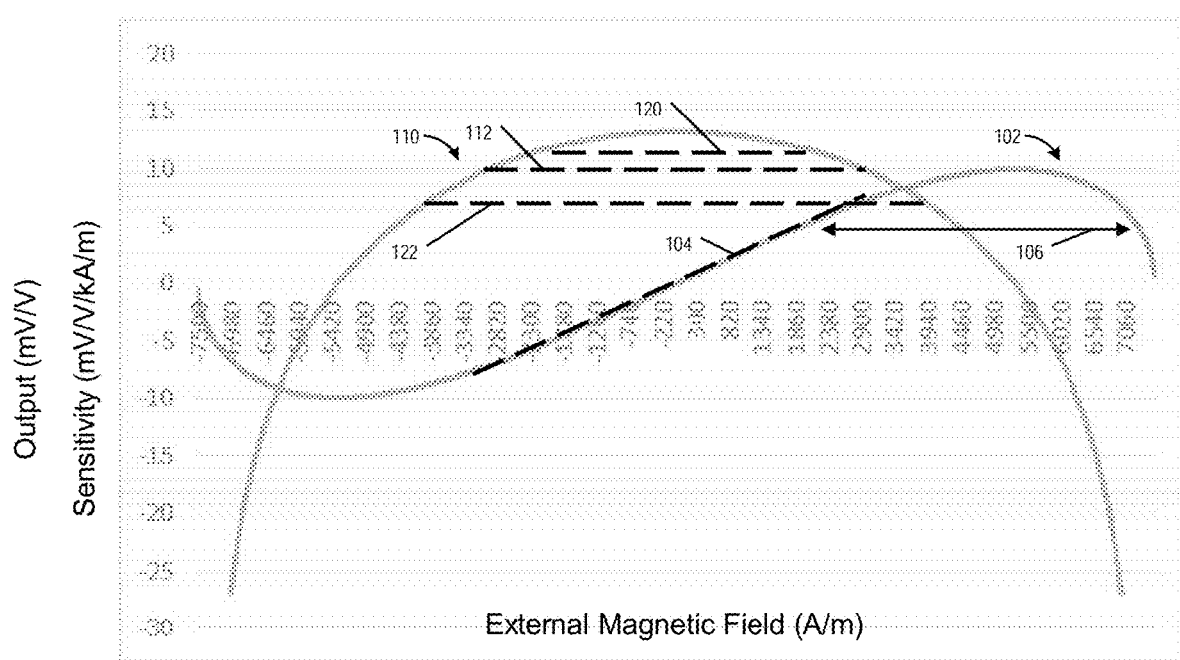
FIG. 1 is a graph illustrating an output voltage of a magnetic sensor and sensitivity of the magnetic sensor responsive to an external magnetic field.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

A sensor is a device that measures a certain property and generates an output indicative of the measured property. A sensitivity of a sensor is a parameter indicative of a slope of a transfer function of a sensor, defined as a ratio between the output of the sensor and the property being measured. For example, for an MR sensor that generates a voltage output measured in Volts (V), indicative of a magnetic field strength measured in Amperes per meter (A/m), the sensitivity has units of V/A/m). Ideally, the sensitivity of a sensor is constant. However, in reality, sensitivity of sensors may vary depending, e.g., on operating conditions (e.g., temperature, bias signal, etc.), manufacturing variations often associated with fabrication processes used by manufacturers (e.g., differences in sensors which were designed to be the same but were manufactured to be slightly different due to, often unintentional, processing variations).

One of the challenges with using MR sensors for magnetic field sensing is the variation of sensitivity of the sensors with external magnetic field and/or temperature. The sensitivity of MR sensors may decrease with the applied external magnetic field as the sensor becomes saturated. Further, when the applied external field exceeds a particular limit, for example 3× the particular limit, the sensitivity of the MR sensor may become negative and the output voltage of the sensor circuit may begin to decrease with the applied external magnetic field. The decreasing voltage with the changing sensitivity of the magnetic sensor can be problematic because, for example, a low output voltage measurement may be due to a low magnetic field measurement or a very high magnetic field measurement when the sensor is operating in a heavily saturated mode.

Some embodiments of the present disclosure provide means for calibrating a magnetic sensor, e.g., an MR sensor, to compensate for possible variations in the sensitivity of the sensor. In one aspect of such embodiments, an apparatus for calibrating a magnetic sensor configured to generate an output signal indicative of magnetic field strength when a bias signal (or, more generally, an input signal) is applied to the magnetic sensor is disclosed. The apparatus includes a test MFG, e.g., a coil or any wire/conductor, configured to generate magnetic fields, e.g. when currents are ran through the test MFG. The apparatus also includes a hardware processor in communication with (i.e., communicatively coupled to) the magnetic sensor, configured to control the test MFG to generate a known magnetic field, control the magnetic sensor to generate a test output signal when the test MFG generates the known magnetic field and a known bias signal is applied to the magnetic sensor, and determine a compensation value (or function) for the compensating the bias signal based on a deviation of the measured test output signal from an expected output signal, where the expected output signal is indicative of an expected magnetic field strength of the known magnetic field. For example, the compensation value may be such as to reduce or minimize the difference between the measured test output signal and the expected output signal when a compensated bias signal is applied to the sensor during measurements. The processor is further configured to determine a compensated bias signal to be applied to the magnetic sensor, where the compensated bias signal is based on the compensation value (or function) and on the bias signal that was applied to the sensor when the sensor generated the test output signal. Using a test MFG that produces a known magnetic field when a certain known bias signal is applied to the sensor allows evaluating and compensating for the changes in the sensitivity of a magnetic sensor by accordingly changing the bias signal driving the sensor. Thus, calibration of a magnetic sensor may include adapting the bias signal applied to the sensor to compensate for sensitivity variations.

Once calibration of the sensor has been concluded with determining the compensated bias signal, sensor measurements (i.e., measurements of unknown magnetic fields in the vicinity of the magnetic sensor) may then be carried out using the compensated bias signal applied to the sensor, or using some variation of the compensated bias signal. For example, in some embodiments, such sensor measurements may be used for contactlessly evaluating currents that might be flowing in one or more conductor wires. During the measurements, the opening of the housing in which one or more magnetic sensors are arranged may be provided around, or enclosing, at least portions of the one or more conductor wires, e.g. so that the wire(s) extend through the opening. The measured outputs of the magnetic sensors may then be combined to evaluate current(s) that might be flowing through each of the one or more conductor wires, e.g., using any of the systems and methods described in co-pending U.S. application Ser. No. 16/003,701, which was filed on Jun. 8, 2018, incorporated herein by reference in its entirety. As used herein the terms such as "determining" or "measuring" or "evaluating" current(s) refer to determining or estimating, e.g. for each of the one or more conductor wires provided within the opening, one or more measures related to currents, such as one or more of current magnitude, direction of the current flow, and location (within the opening) of the current-carrying conductor wire being measured.

Other aspects of the present disclosure provide methods for operating apparatuses as described herein and methods for calibrating magnetic sensors and determining currents in at least one conductor wire using said sensors.

Another challenge with using magnetic sensors for magnetic field sensing is that conventional housing structures in which magnetic sensors are provided may not always fit inside tight places or other constrained areas. Some embodiments of the present disclosure aim to provide an improvement in this respect by using flexible housing in which magnetic sensors may be provided, and/or by using flexible circuit boards on which magnetic sensors may be built.

Principles and advantages discussed herein can be used in any device to measure/evaluate the current flowing through a wire. Further, embodiments disclosed herein can be used to increase the size of the magnetic field that can be measured by a magnetic sensor while maintaining operation of the magnetic sensor in a linear mode. Moreover, embodiments disclosed herein can be used to compensate for changes in sensitivity of magnetic sensors over a larger temperature range.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

As will be appreciated by one skilled in the art, aspects of the present disclosure, in particular, aspects of magnetic sensor calibration (e.g., aspects of adapting the bias signal to compensate for sensitivity variations) and aspects of current measurement using magnetic sensors as described herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more hardware processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g. to the existing magnetic sensors, apparatuses that include such magnetic sensors, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. For example, while some descriptions refer to MR sensors, and, in particular, to anisotropic MR sensors (AMRs), these embodiments are not limited to such sensors and are equally applicable to MR sensors other than AMRs, and/or to magnetic sensors other than MR sensors. In the following description, references are made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Magnetic Sensor Mode Detection and Sensitivity Calibration

FIG. 1 is a graph illustrating sensitivity of a magnetic sensor and an output voltage of the magnetic sensor responsive to an external magnetic field. Curve 102 represents the output voltage of a magnetic sensor circuit comprising a set of MR sensors in a Wheatstone bridge configuration. As illustrated by the curve 102, the output voltage of the magnetic sensor can increase linearly as an applied external magnetic field varies between −3000 and 3000 Ampere per meter (A/m). This linear region is represented by the dashed line 104. The graph of FIG. 1 is for an example magnetic sensor. Magnetic sensors of different types or two magnetic sensors of the same type may produce different outputs due to, for example, tolerances of the components used to manufacture the magnetic sensors. Thus, each magnetic sensor may produce a different output for a particular external magnetic field and FIG. 1 may differ for two different magnetic sensors.

As described above, as the sensitivity of the magnetic sensor drops because, for example, saturation of the sensor, the output voltage may also drop. Accordingly, as illustrated by the curve 106, a magnetic sensor may have the same output voltage when different external magnetic fields are applies. Thus, because in some cases the applied magnetic field may not be determinable based on the output of the magnetic sensor, it may not be possible to accurately measure the current flowing through a wire using a current measurement apparatus with magnetic sensors. Not being sure of the current flowing through the wire can be dangerous for a technician or other user and can create unsafe situations.

The curve 110 is the derivative of the curve 102 and represents the sensitivity of the magnetic sensor circuit. As illustrated by the dashed line 112, where the sensitivity of the magnetic sensor is relatively high (e.g., above 10 mV/V/kA for the example magnetic sensor of FIG. 1) the output of the magnetic sensor is linear and the magnetic sensor is operating in a linear mode. In the linear mode, the output voltage of the magnetic sensor operates as a one-to-one function. For a particular magnetic field in the linear region, a particular voltage is output by the magnetic sensor. However, when the sensitivity of the magnetic sensor beings to fall below 10 mV/V/kA, the output of the magnetic sensor begins to saturate. In the saturation mode, the output voltage of the magnetic sensor operates as a two-to-one function. For example, a field of 2000 A/m or 7000 A/m may produce the same output voltage in the magnetic sensor. Having two different magnetic fields produce the same output voltage can result in robustness and safety issues when relying on the output of the magnetic sensor to accurately determine a current flowing in a wire.

Figure 2:
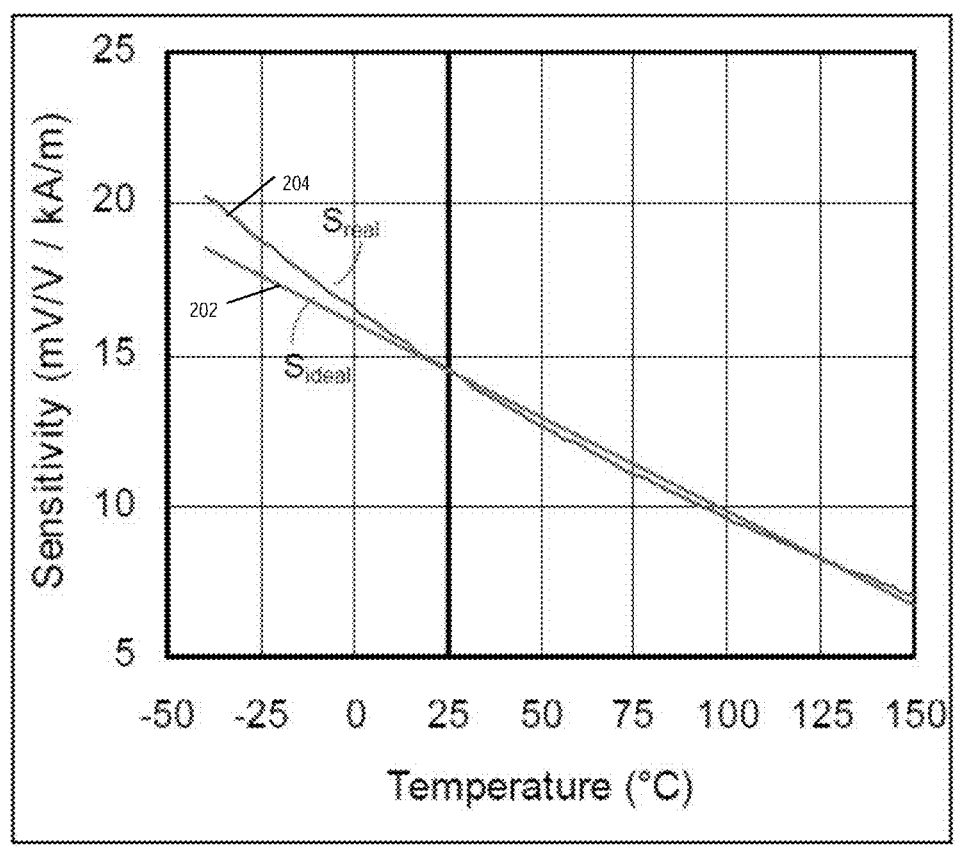
FIG. 2 is a graph illustrating the impact of temperature on sensitivity of a magnetic sensor.

The sensitivity of the magnetic sensor can vary with temperature. FIG. 2 is a graph illustrating the impact of temperature on sensitivity of a magnetic sensor. Curve 202 illustrates the decrease of sensitivity of a magnetic sensor with an increase in temperature in an ideal condition. Curve 204 illustrates the decrease of sensitivity of a magnetic sensor with an increase in temperature in a realistic case. As illustrated from the curves 202 and 204, as temperature increases, the magnetic sensors become less sensitive. Typically, the decrease of sensitivity is approximately 0.36%/K. Thus, a magnetic field measured by a magnetic sensor may become less reliable as temperature increases. It can therefore be desirable to compensate for temperature.

In certain embodiments, the aforementioned problems can be addressed by measuring the sensitivity of the magnetic sensors in real time. Measuring the sensitivity of the magnetic sensors in real time can include measuring the sensitivity of the sensors as a user is operating a device, such as a current measurement apparatus, that includes the magnetic sensors. In some embodiments, measuring the sensitivity of the magnetic sensors may be performed as part of a calibration process that can be initiated prior to the user using the device and/or intermittently during use of the device. While example embodiments in this disclosure are described in the context of a current measurement apparatus that includes magnetic sensors, other devices that include magnetic sensors can be implemented in accordance with any suitable principles and advantages disclosed herein.

Measuring the sensitivity of a magnetic sensor can enable the current measurement apparatus to determine the mode of operation (e.g., a linear mode or a saturation mode) within which the magnetic sensor is operating. Moreover, in certain embodiments, linearity calibration can be performed to increase an operational range of the magnetic sensor such that the output voltage measurement of the magnetic sensor can be used to calculate the external magnetic field accurately over the increased operational range.

As mentioned above, the magnetic sensor may be a magnetic sensor system that includes a plurality of individual magnetic sensors configured as a Wheatstone bridge. The individual magnetic sensors may be referred to as a "magnetic sensing element" and a plurality of magnetic sensing elements combined together, e.g., in the Wheatstone bridge configuration, may be referred to as a "magnetic sensor." In some embodiments, a plurality of individual magnetic sensors may be configured as a half-Wheatstone bridge. The magnetic sensors, such as anisotropic magnetoresistive (AMR) sensors, can sense the magnetic field strength in a given direction in relation to their internal magnetization. Embodiments disclosed herein are not limited to AMR sensors and can use others types of magnetoresistive sensors including, but not limited to, giant magnetoresistive (GMR) sensors, tunnel magnetoresistive (TMR) sensors, colossal magnetoresistive (CMR) sensors, and extraordinary magnetoresistive (EMR) sensors. Magnetoresistive (xMR) sensors can include any suitable sensor that has a resistance that changes in response to a magnetic field. In certain embodiments, Hall Effect sensors can be used with the calculations disclosed herein to determine current flow in a wire. The sensors can be used in a current measurement apparatus to measure the current in a wire or multi-conductor cable.

Figure 3:
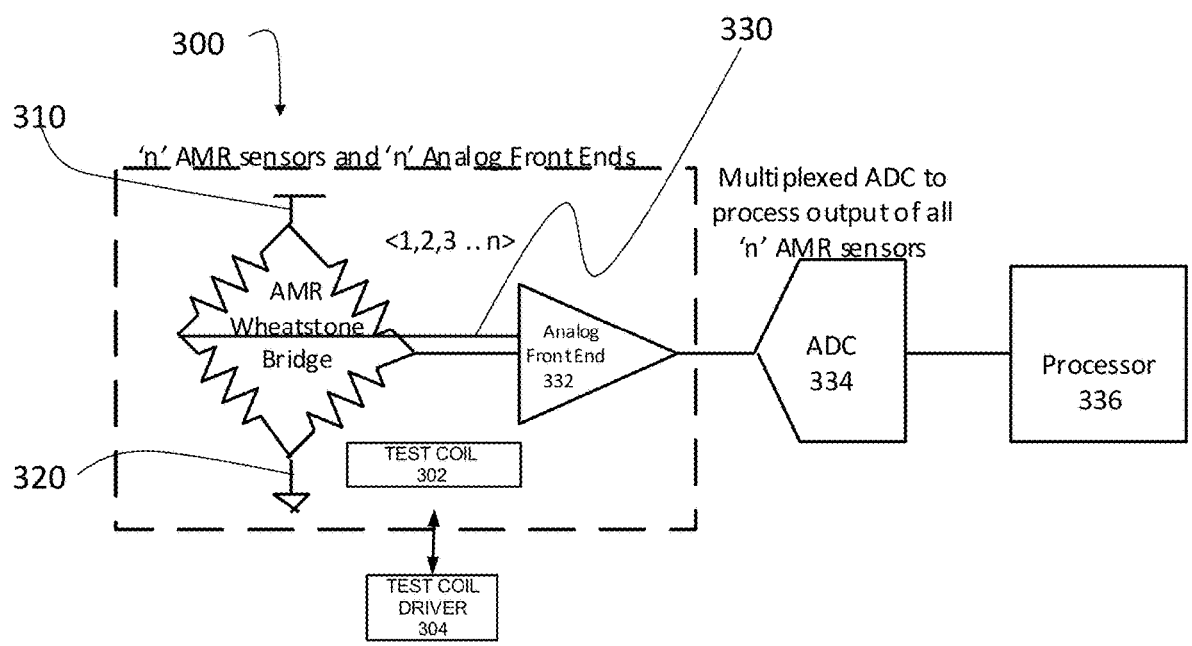
FIG. 3 is a block diagram illustrating an example portion of a magnetic sensor system, according to some embodiments of the present disclosure.

FIG. 3 is a block diagram illustrating an example portion of a magnetic sensor system 300 in accordance with certain embodiments. The sensor system 300 may include a set of magnetic sensing elements configured as a Wheatstone bridge, coupled to a bias signal source at a point 310 shown in FIG. 3, and coupled to the ground at a point 320 shown in FIG. 3. Configuring a plurality of magnetic sensing elements in a Wheatstone bridge creates a magnetic sensor, whose output voltage is proportional to the magnetic field strength in a given direction.

The magnetic sensor formed of a magnetic sensing elements can output a voltage 330 that is proportional to a magnetic field strength in a specific direction at the location of the sensors. This measured voltage 330 may be provided to an analog front-end 332, which can condition a signal received from the sensor. In certain embodiments, conditioning the signal 330 received from the sensor enables the signal to be provided to subsequent circuitry, such as an analog-to-digital converter (ADC) 334. In the illustrated embodiments, the conditioned signal can be provided to a multiplexed ADC, which provides the digital signal corresponding to the field strength to a processor or microcontroller 336. The elements within the dashed line box may be one of a number of sensors (or sensor circuits), each of which may include four magnetic sensing elements arranged in a Wheatstone bridge, as shown in the example illustrated in FIG. 3, or two magnetic sensing elements arranged in a half-Wheatstone bridge. Each of the sensor circuits may be in electrical communication with the multiplexed ADC 334, which provides the digital field measurement to the processor 336. A plurality of sensor circuits as shown within the dashed box in FIG. 3 may be positioned around a target measurement area of a current measurement apparatus, e.g., within a housing of a current measurement apparatus.

In certain embodiments disclosed herein, the sensor circuits can be positioned symmetrically on a printed circuit board (PCB) or symmetrically around a target measurement area. In other embodiments, the sensor circuits may be positioned at various locations to improve or maximize the accuracy of the sensor measurements. In some embodiments, the sensor circuits can be positioned using any suitable principles and advantages described in U.S. application Ser. No. 15/812,849, which was filed on Nov. 14, 2017 and is titled "CURRENT MEASURING APPARATUS AND METHODS," the disclosure of which is hereby incorporated by reference in its entirety herein. In other embodiments, the sensor circuits can be positioned using any suitable principles and advantages described in U.S. application Ser. No. 16/003,701, which was filed on Jun. 8, 2018 and is titled "CONTACTLESS CURRENT MEASUREMENT USING MAGNETIC SENSORS," the disclosure of which is also hereby incorporated by reference in its entirety herein.

Figure 4:
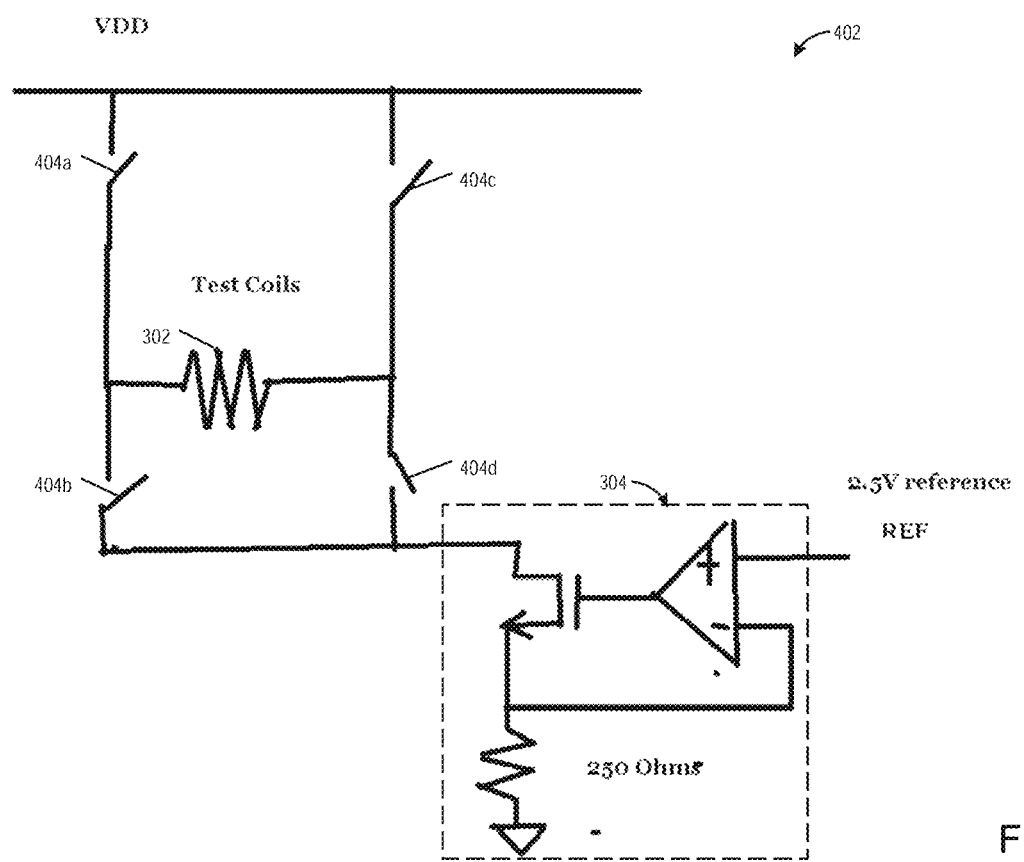
FIG. 4 illustrates example circuitry for a test magnetic field generator (MFG) and test MFG driver, according to some embodiments of the present disclosure.

To measure the sensitivity of a magnetic sensor or magnetic sensor circuit, a test MFG 302 (shown in FIG. 3 as a "test coil 302" but, in general, any wire/conductor may be used, which does not have to be coiled) can be positioned relatively close to the magnetic sensor inside the package that includes the magnetic sensor. This test MFG 302 may be used to excite the magnetic sensor with a test field in the presence of the external magnetic field measured. In certain embodiments, the test MFG 302 can be replaced with an alternative magnetic field generating device or circuit. A test MFG driver 304 may drive the test MFG 302 using a current generated by an amplifier that drives a reference voltage across a zero temperature coefficient (TC) resistor. The zero TC resistor has a TC that is approximately zero. The zero TC resistor can have a resistance that does not vary with temperature, or does not vary above a threshold over a particular range of temperature. Driving the reference voltage across the zero TC resistor can cause a fixed current to be generated that generates an excitation test field in or around the magnetic sensor. As illustrated in FIG. 4, the test MFG 302 may be connected to the test MFG driver 304 using switches that can apply positive negative or zero test current in the test MFG 302.

FIG. 4 illustrates example circuitry for a test MFG and test MFG driver in accordance with certain embodiments. FIGS. 3 and 4 illustrate one example embodiment of a test MFG and test MFG driver. Other embodiments are possible in accordance with the teachings disclosed herein. The test MFG and test MFG driver may be part of a field sensitivity test circuit 402 that includes the test MFG 302, the test MFG driver 304, and switches 404a, 404b, 404c, and 404d, which may collectively or individually be referred to as switch or switches 404.

The switches 404a and 404d can be closed to cause a current of a first phase (e.g., a positive current) that flows over the test MFGs 302. Similarly, the switches 404b and 404c can be closed to cause a current of a second phase (e.g., a negative current) that is the opposite phase of the first phase and that flows over the test MFGs 302.

A correlated double sampling process can be performed to determine a contribution of the magnetic field generated by the test MFG on an output of the magnetic sensor. This process can involve measuring the output of the magnetic sensor when a positive current flows over the test MFGs 302 and measuring the output of the magnetic sensor when a negative current flows over the test MFGs 302. The two measurements may be subtracted, which results in the contribution from an external field being cancelled. The remaining value can be attributed to the field generated by the test MFG.

Using the correlated double sampling technique, it is possible to generate the sensitivity of the magnetic sensor as represented by the line 110 of FIG. 1 for varying external magnetic field. Once the sensitivity curve is known, it is possible to determine whether the magnetic sensor is operating in a saturated or linear mode based on the sensitivity measured for the magnetic sensor.

By determining the sensitivity of the magnetic sensor, it is possible to determine whether the magnetic sensor is operating in a linear mode or a saturation mode. This determination may be made based on whether the sensitivity of the magnetic sensor, or the slope of the sensitivity line satisfies a threshold. For example, continuing with the example of FIG. 1, if it is determined that the sensitivity of the magnetic sensor as determined from using the test MFG 302 is above 10 or 12 mV/V/kA, the magnetic sensor can be determined to be operating in a linear mode. Conversely, if it is determined that the sensitivity of the magnetic sensor as determined from using the test MFG 302 is below 10 or 12 mV/V/kA, the magnetic sensor can be determined to be operating in a saturation mode. It should be understood that the line 110 and the threshold used for determining whether the magnetic sensor is operating in a linear or saturation mode may differ for two different magnetic sensors. For example, magnetic sensors of different types, made with different materials, having different tolerances, or using different manufacturing processes may have different sensitivities.

As previously described, determining the output of the magnetic sensor when an external magnetic field is applied may be insufficient to determine the strength of the magnetic field because, as illustrated by the line 106, there are multiple external magnetic fields that can cause the magnetic sensor to output the same value. And, in some cases, one value occurs when the magnetic sensor is in a linear operating mode and one value occurs when the magnetic sensor is in a saturated operating mode. However, by using the test MFG 302 to determine the sensitivity curve 110 for the magnetic sensor, it is possible to determine whether the magnetic sensor is in a linear or saturated region, and consequently, the external magnetic field that is associated with the output voltage produced by the magnetic sensor when measuring the strength of the external magnetic field.

In some embodiments, when the magnetic sensor is operating in the saturated mode, its measurements may be unreliable and should not be used to measure a current in a wire. Consequently, in certain embodiments, a current measurement apparatus can output an indication of the operating mode of the magnetic sensors on a display to inform the user whether the user can reliably measure the current in a wire. Alternatively, the current measurement apparatus may indicate that the current in the wire should not be measured with or without an explanation as to the reason why. In some cases, the current measurement apparatus may indicate that an external magnetic field strength is too high to measure the current flowing in the wire. The current measurement apparatus may suggest compensation methods that may be available, such as moving the current measurement apparatus with respect to the wire to be measured to balance the external magnetic field applied to a set of sensors within the current measurement apparatus. In other embodiments, an error may be output on the display of the current measurement apparatus.

The test MFG 302 and/or the test MFG driver 304 may be included on a separate PCB as one or more of the magnetic sensors. Alternatively, the test MFG 302 and/or the test MFG driver 304 may be on the same PCB or the same integrated circuit as one or more of the magnetic sensors.

An alternative solution to determining the operational state of the magnetic sensor is to include a field negating MFG that negates the external magnetic field leaving an approximately zero field in the center of your measurement zone. A current may be provided to the MFG to generate a magnetic field that is opposite in phase to the external magnetic field, but of the same magnitude causing the two magnetic fields to cancel each other out. The amount of current provided to the MFG to negate the external magnetic field may be indicative of the external magnetic field. By cancelling the external magnetic field, the magnetic sensor will typically operate in the linear region. This alternative solution can use a relatively high amount of power relative to the use of the test MFG 302 and test MFG driver 304. Further, the field negating MFG is typically constantly powered, resulting in even greater power consumption than the use of the test MFG 302 and test MFG driver 304.

Advantageously, in certain embodiments, the test MFG 302 and the test MFG driver 304 use significantly less power than the alternative solution. For example, while the test MFG 302 and test MFG driver may utilize 1 milliamp or less of current, the alternative solution may consume as much as 150 milliamps to compensate for a 5 milliTesla external magnetic field. In this example, the alternative solution may use up to 150 times the power of the test MFG 302 and the test MFG driver 304 solution. To compensate for a 100 A signal, the alternative solution may use between 100 mA and 1 A compared to the 1-10 mA to determine the mode of the magnetic sensor using the test MFG 302 and the test MFG driver 304 solution. Moreover, as explained above, the alternative solution is an always-on solution to maintain the compensation of the external magnetic field. Thus, the 100 mA to 1 A is applied continuously in the alternative solution. In contrast, the test MFG 302 and the test MFG driver 304 solution may be applied for a relatively short time for each period of time. For example, the 1-10 mA may be applied every millisecond for 10 microseconds. For the remainder of the time, the test MFG 302 and the test MFG driver 304 may remain unpowered. Further, the operating mode determined during the 10 microseconds may be assumed for the remaining time until the next scheduled determination period. As test MFG 302 and the test MFG driver 304 solution is used intermittently, it uses even less power compared to the always-on alternative solution.

In addition to determining the mode of operation of the magnetic sensors, the test MFG 302 and the test MFG driver 304 can be used to compensate for the external magnetic field to increase the linear operational range of the magnetic sensor. At startup of the current measurement apparatus, the test MFG 302 can be used to generate both a small and a large external magnetic field to measure the output of the magnetic sensor to perform a linearity calibration.

In one embodiment, a 5th order linearity calibration operation can be used to calibrate the magnetic sensors or the current measurement apparatus. The calibration operation can include applying a few different currents to the test MFG 302. For example, the test MFG 302 can be excited with one or more 10 mA current pulses at a zero external field to measure offset and sensitivity. Further, the test MFG 302 can be excited with 75 mA and 100 mA current pulses to generate 3000 A/m and 4000 A/m fields to calculate the 3rd and 5th order coefficients of the linearization equation. Other current values can be used instead of or in addition to the above examples. For example, test currents of +/−15 mA and/or +/−200 mA can be applied to the test MFG 302. Once the different sensitivity data points are obtained for the magnetic sensor, it is possible to perform the 5th order linearity calibration operation with the obtained datapoints. By applying the result of the 5th order linearity calibration operation to the magnetic sensor, the integral non-linearity (INL) can be extended or flattened out over a larger magnetic field range. The INL may represent a deviation between an ideal output value for the magnetic sensor and the actual measured output value. Accordingly, the closer the INL value is to zero, the more reliable the output of the magnetic sensor.

Figure 5:
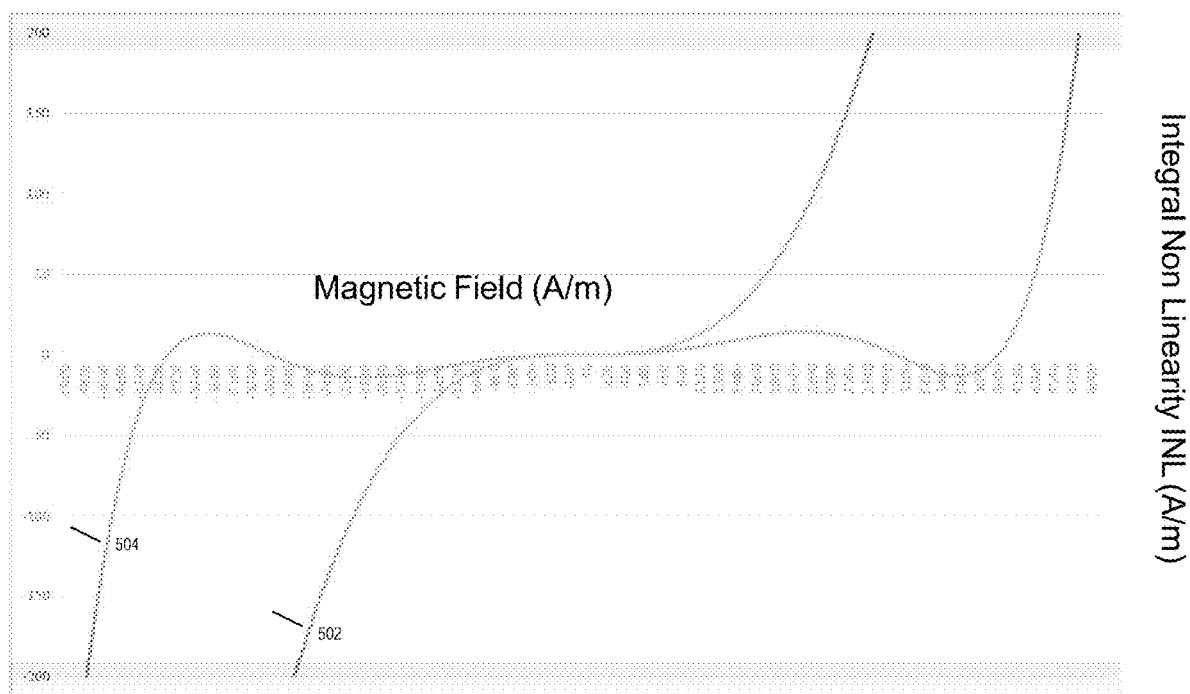
FIG. 5 is a graph illustrating a result of linearity calibration process using the test MFG driver, according to some embodiments of the present disclosure.

FIG. 5 is a graph illustrating a result of linearity calibration process using the test MFG driver in accordance with certain embodiments. The curve 502 represents the pre-compensation INL for a magnetic sensor. As illustrated, the curve 502 is close to zero for a magnetic field of +/−1000 A/m. In certain embodiments, based on a desired tolerance for the magnetic sensor, the magnetic sensor may be used to measure a magnetic field of between +/−1500 or +/−2000 A/m before the error makes the sensor reading too unreliable. associated with the output of the magnetic sensor may be sufficiently low After +/−1000 A/m, there is a sharp drop-off in the error. The range in which the INL or error is sufficiently low for the magnetic sensor to measure to the magnetic field may correspond to the line 120 of FIG. 1 where the sensitivity of the magnetic sensor is relatively flat (e.g., approximately 12 mV/V/kA or higher).

Returning to FIG. 5, the curve 504 represents the post-compensation INL for the magnetic sensor. As illustrated, the curve 504 remains flat for a significantly greater range of the magnetic field than the pre-compensated sensor represented by the line 502. For example, the line 504 is relatively flat for a magnetic field strength of between +/−3000 A/m. Further, allowing for an error of up to +/−50 A/m corresponding to the range in magnetic field of +/−2000 A/m of the uncompensated or pre-compensated magnetic sensor of line 502, the post-compensated magnetic sensor may reliable for a range of approximately +/−4500 A/m. This range may correspond to the line 122 of FIG. 1 enabling the magnetic sensor to be used over a greater range in sensitivity (e.g., approximately 7 mV/V/kA or higher).

This process can be performed at startup, or in a calibration mode, when the external magnetic field applied is assumed to not be significant and therefore, unlikely to cause the magnetic sensor to over-range or saturate when the test MFG 302 current pulses are applied. To ensure or improve the likelihood that the external field is zero or substantially near-zero excluding, for example, the background magnetic field of the Earth, the current measurement apparatus may instruct a user to perform a calibration process away from the current-carrying wires to be measured. In some embodiments, the current measurement apparatus can determine if there is an external magnetic field exceeding a particular strength within a particular distance of the current measurement apparatus. If it is determined that the external magnetic field exceeds a particular strength and/or is within a particular distance, the current measurement apparatus can inform the user that the calibration cannot be performed. The user can then relocate to an area where calibration can be performed prior to using the current measurement apparatus. Moreover, as sensitivity of the magnetic sensor can change with temperature, the calibration process can be used to compensate, at least in part, for a change in sensitivity of the magnetic sensor.

Example Current Measurement Apparatus

Figure 6:
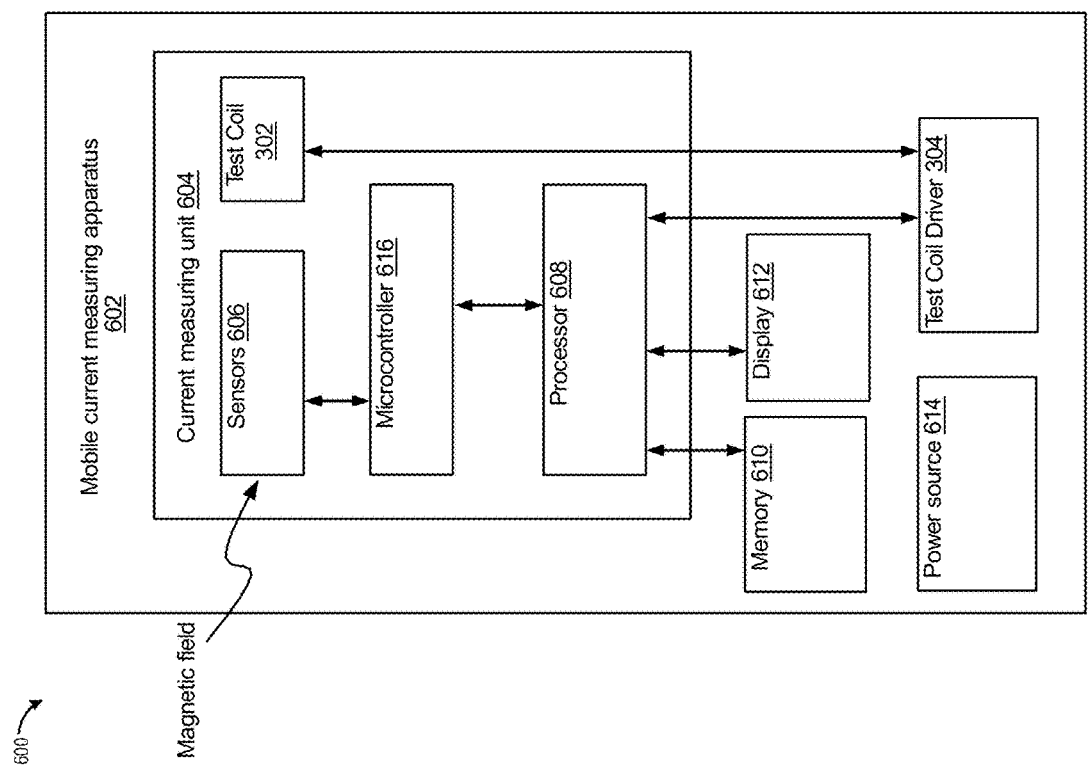
FIG. 6 is a block diagram illustrating an example current measurement system, according to some embodiments of the present disclosure.

FIG. 6 is a block diagram illustrating an example current measurement system in accordance with certain embodiments. The illustrated system includes a current measurement apparatus 602, which could be a mobile current measurement apparatus, having a current measurement unit 604, a memory 610, a display 612, and a power source 614. The current measuring unit 604 may include sensors 606, a microcontroller 616, and a processor 608. This processor 608 may be configured to implement one or more software programs. These software programs may include software for interacting with a user and/or for outputting measurement of a current flow within a wire or multi-conductor cable on the display 612. The microcontroller 616 may include circuitry that implements one or more processes for calibrating magnetic sensors and/or measuring current in a wire or multi-conductor cable. In some embodiments, the processes implemented by the microcontroller 616 may include processes for determining a location of a wire or multi-conductor cable within a measurement zone by, for example, performing a non-linear least square fit process and using the location of the wire or multi-conductor cable to determine current flow within the wire or multi-conductor cable. In some embodiments, the processes implemented by the microcontroller 616 may include processes for performing calibration of magnetic sensors according to any of the embodiments described herein. In some embodiments, the processes implemented by the microcontroller 616 may include processes for controlling any of the components of the current measurement apparatus 602 to operate in accordance with various embodiments described herein, both for calibration of the sensors 606 and for performing actual measurements using the sensors 606. The microcontroller 616 may be implemented using application-specific hardware, a digital signal processor, or a programmable gate array, such as a field programmable gate array (FPGA). In some embodiments, the microcontroller 616 may be implemented using a general purpose processor. Further, in some embodiments, the microcontroller 616 may be implemented as part of the processor 608. The processor 336 shown in FIG. 3 may include the processor 608 and/or the microcontroller 616 of FIG. 6.

The sensors 606 are magnetic sensors configured to sense, for example, the differential magnetic field generated by current flowing through a wire. The sensors 606 may include a number of sensor circuits positioned around a target measurement zone for measuring the current in a wire, or positioned to measure the current of a wire placed within a target measurement zone. For example, the sensors 606 may include 4, 8, or 12 sensor circuits, among other numbers of sensor circuits. In some embodiments, each of the sensors 606 may be a sensor circuit that itself comprises one or more magnetic sensing elements. For example, each sensor 606 may be a sensor circuit that may include 2 or 4 magnetic sensing elements, among other numbers of magnetic sensing elements, e.g., arranged in a Wheatstone bridge configuration.

It is possible to position sensors 606, such as AMR sensors, in a circular fashion to contactlessly measure current in a single conductor cable or wire. The AMR sensors may be laid out in the XY plane in a circular fashion with the wire passing through an opening in the Z direction. Errors due to positioning of the wire can be reduced and/or minimized by using a greater number of sensors and/or by using averaging techniques to measure the current flow in a single conductor cable. In some embodiments, the sensor circuits 606 can be positioned using any suitable principles and advantages described in U.S. application Ser. No. 15/812,849, which was filed on Nov. 14, 2017 and is titled "CURRENT MEASURING APPARATUS AND METHODS," the disclosure of which is hereby incorporated by reference in its entirety. In other embodiments, the sensor circuits 606 can be positioned using any suitable principles and advantages described in U.S. application Ser. No. 16/003,701, which was filed on Jun. 8, 2018 and is titled "CONTACTLESS CURRENT MEASUREMENT USING MAGNETIC SENSORS," the disclosure of which is also hereby incorporated by reference in its entirety herein.

The current measurement apparatus 602 may further include a test MFG 302 and a test MFG driver 304. The test MFG 302 may be integrated into the current measuring unit 604 such that the test MFG 302 is located with or close to the sensors 606. By having the test MFG 302 near one or more of the sensors 606, it is possible to use a magnetic field generated by the test MFG 302 to calibrate one or more of the sensors 606 and/or to determine whether one or more of the sensors 606 is operating in a linear or saturation mode, according to any embodiments described herein.

The processor 608 can configure the test MFG driver 304 to apply different currents to the test MFG 302. As previously described, at startup or during a calibration procedure, the processor 608 can cause the test MFG driver 304 to apply several currents to the test MFG 302 to determine a compensation factor for the sensors 606. Intermittently, the processor 608 can cause the test MFG driver 304 to apply a small current (e.g., 1 mA) to determine whether one or more of the sensors 606 are operating within a saturation mode, instead of a desired linear mode. Using the information regarding the operating mode of the sensors 606, the processor 608 can cause the display 612 to output an error or more information for the sensors 606.

In some embodiments, some or all of the memory 610, the display 612, and the power source 614 may reside in the same integrated unit as the sensors 606 and the processor 608. The current measurement system 600 can implement any suitable principles and advantages described in U.S. Pat.

No. 9,689,903, which issued on Jun. 27, 2017 and is titled "APPARATUS AND METHODS FOR MEASURING CURRENT," the disclosure of which is hereby incorporated by reference in its entirety herein.

The memory 610 may be a non-transitory machine-readable storage medium such as a RAM, ROM, EEPROM, etc. The memory 610 may be in communication with the processor 608, which may read from or write to the memory 610. The display 612 may be configured to show the result of the calibration and/or the result of the current measurement performed in accordance with various embodiments described herein. The display 612 may be any type of screen display, such as plasma display, liquid crystal display (LCD), organic light emitting diode (OLED) display, electroluminescent (EL) display, or any other indicator, such as a dial, barometer, or light emitting diodes (LEDs). Further, in some embodiments, the display 612 may be a touchscreen display. In some implementations, the system may include a driver (not shown) for the display 612. The power source 614 may provide power to substantially all components of the system of FIG. 6. In some implementations, the power source 614 may be one or more battery units.

Adapting the Bias Signal to Compensate for Sensitivity Variations

As described above, one of the challenges with using MR sensors is variation of sensor sensitivity due to external factors such as temperature, manufacturing variations, or external magnetic fields. A test MFG integrated within a magnetic sensor system may be used to perform calibration of the system to reduce or eliminate negative effects of these variations (i.e., to at least partially compensate for sensitivity variations of one or more magnetic sensors in a magnetic sensor system). Various embodiments of magnetic sensor calibration will now be described with reference to the magnetic sensor system 300 shown in FIG. 3. However, in general, any magnetic sensor system, configured to perform calibration as described herein, is within the scope of the present disclosure.

Embodiments of the present disclosure related to MR sensor calibration are based on realization that, when a magnetic sensor includes one or more resistors as magnetic sensing elements, the output signal from the magnetic sensor depends not only on the resistance values of the resistors (which resistance values are, in turn, indicative of the magnetic field around the resistors) but also on the bias signal (or, more generally, an input signal) applied to the sensor, and that the bias signal may be adapted to compensate for sensitivity variations of the sensor, thus calibrating the sensor. This principle may be explained with reference to an example magnetic sensor system 700 shown in FIGS. 7A and 7B, providing schematic illustrations of changes in resistor values in a Wheatstone bridge magnetic sensor due to magnetic fields, according to some embodiments of the present disclosure.

Figure 7A:
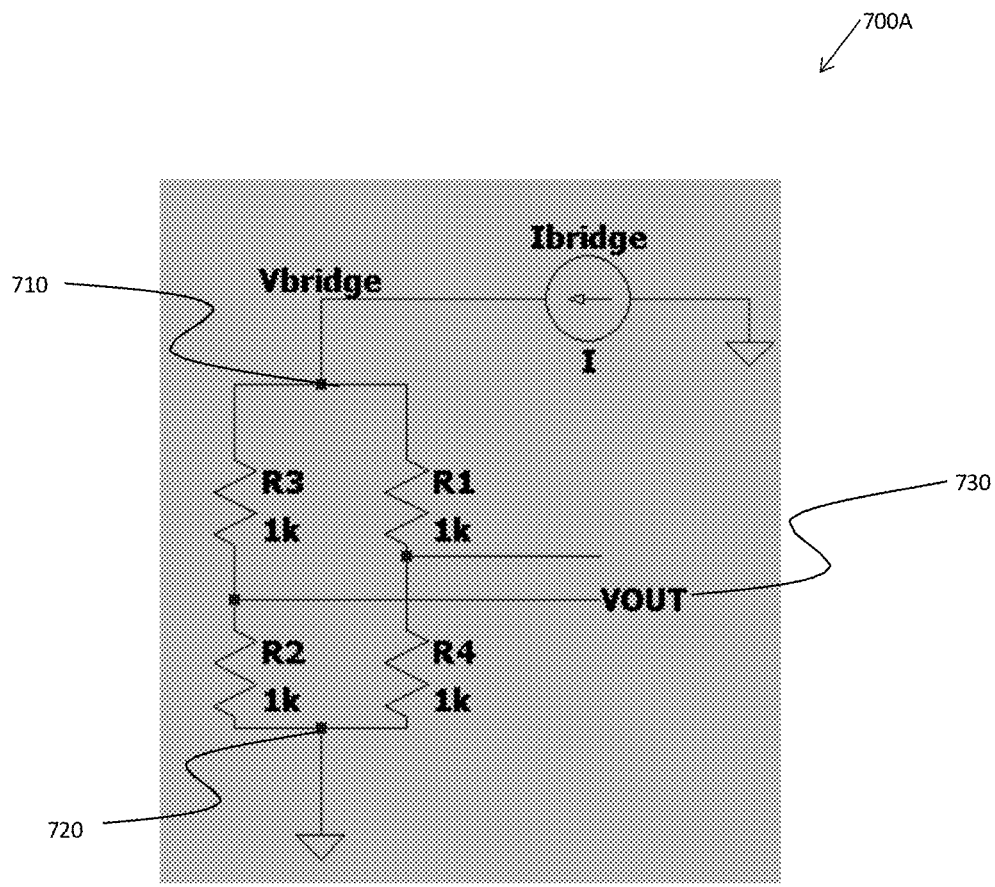
FIGS. 7A and 7B provide schematic illustrations of changes in resistor values in a Wheatstone bridge magnetic sensor due to magnetic fields, according to some embodiments of the present disclosure.
Figure 7B:
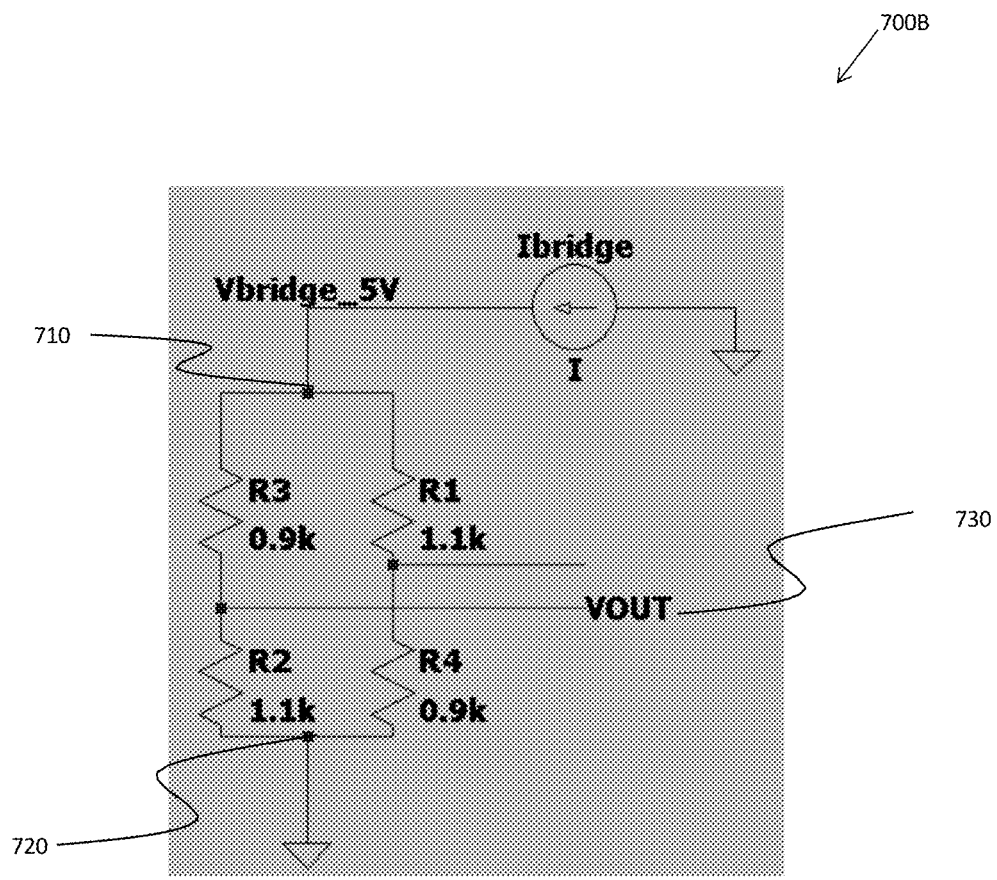

The magnetic sensor system 700 (labeled as a system 700A in FIG. 7A and as a system 700B in FIG. 7B due to the differences in resistor values) is similar to that shown in FIG. 3. First of all, the resistors R1, R2, R3, and R4, shown in FIGS. 7A and 7B are examples of magnetic sensing elements which may be implemented in a magnetic sensor implemented as an AMR Wheatstone bridge as shown in FIG. 3. Second, a point 710 shown in FIGS. 7A and 7B is analogous to the point 310 shown in FIG. 3, in that this may be considered as a node from which a bias signal (shown in the example of FIGS. 7A-7B as a voltage signal Vbridge, or a current signal (bridge) is applied to the magnetic sensor formed of the resistors R1-R4. Third, a point 720 shown in FIGS. 7A and 7B is analogous to the point 320 shown in FIG. 3, in that this may be considered as a ground connection of the magnetic sensor formed of the resistors R1-R4. Finally, an output signal 730 shown in FIGS. 7A and 7B is analogous to the output signal 330 shown in FIG. 3, in that this is a signal generated by the magnetic sensor, which signal is indicative of the magnetic field sensed by the sensor (the output signal 730 is shown in the example of FIGS. 7A-7B as a voltage signal VOUT). Unless specified otherwise, descriptions provided with reference to FIG. 3 are applicable to the magnetic sensor system 700 and, therefore, are not repeated here. Although descriptions of the magnetic sensor system 700 are provided for the example of 4 resistors arranged in a Wheatstone bridge configuration, they may be applied to any other number of magnetic sensing elements, e.g., 2 resistors arranged in a half-Wheatstone bridge configuration, all of which being within the scope of the present disclosure.

In some embodiments, the input/bias signal applied to the magnetic sensor at point 710/310 may be a Vdd signal, i.e., the highest input voltage/current signal applied to the bridge. In some embodiments, such an input/bias signal may be based on one or more of a proportional to absolute temperature (PTAT) signal (either PTAT voltage or PTAT current signal), a complementary to absolute temperature (CTAT) signal (either CTAT voltage or CTAT current signal), and/or a zero temperature coefficient absolute temperature (ZTAT) signal (either ZTAT voltage or ZTAT current signal). In various embodiments, the input/bias signal being "based on" one of these signals could be that the input signal is that signal, a polynomial of that signal, etc.

FIG. 7A illustrates a scenario where all of the resistors of a given magnetic sensor are of equal value, e.g., each having a resistance of 1 kiloOhm, as shown in FIG. 7A with values (1 k) next to each of the resistors R1-R4. When all of the resistors arranged in a magnetic sensor as a Wheatstone bridge are of equal value, the Wheatstone bridge is perfectly balanced and the output voltage 730 may be zero volts, or any other set value. In a Wheatstone bridge sensor, magnetic fields applied to the resistors change the resistor values in the bridge, resulting in a change in the output voltage 730. Consider an example shown in FIG. 7B, where it is assumed that magnetic fields in the vicinity of the Wheatstone bridge changed the resistor values to be as follows: each of R1 and R2 are 1.1 k (instead of 1 k, as was in the example of FIG. 7A), and each of R3 and R4 are 0.9 k (instead of 1 k, as was in the example of FIG. 7A). In such an example, the output voltage 730 may be calculated as follows: VOUT=Vbridge× [(0.9V/2V)−(1/1V/2V)]. Assuming that the bias signal Vbridge is, e.g., 5V, the output voltage VOUT may then be equal to −0.1V. This example illustrates that the output voltage 730 depends on 1) change in the resistance values of the magnetic sensing elements of a sensor, and 2) the bias signal applied to the sensor.

For various reasons as described above, the amount that the resistors of a magnetic sensor change with a given magnetic field may vary (i.e., resistor sensitivity may change). According to the embodiments of the present disclosure, this change in resistor sensitivity can be compensated by changing the value of the bias signal, e.g., Vbridge, applied to the sensor. Namely, by using the test MFG 302, as shown in FIG. 3, a known magnetic field can be applied to the sensor circuit, and the bias signal applied provided to the sensor circuit may be then be set (i.e., a compensated bias signal may be determined) so that the sensor circuit generates an output signal that is expected for the known magnetic field. Such a compensated bias signal, or a bias signal that is derived from such a compensated bias signal, may then be used to sense unknown magnetic fields which may be applied to the sensor circuit, e.g., in order to perform contactless current measurements as described herein.

Temperature is one example of a parameter that may change sensitivity of a magnetic sensor. If this process is repeated at multiple temperatures, then it is possible to apply correct bias signal over a range of temperatures, to compensate the sensor over said range of temperatures.

Figure 8:
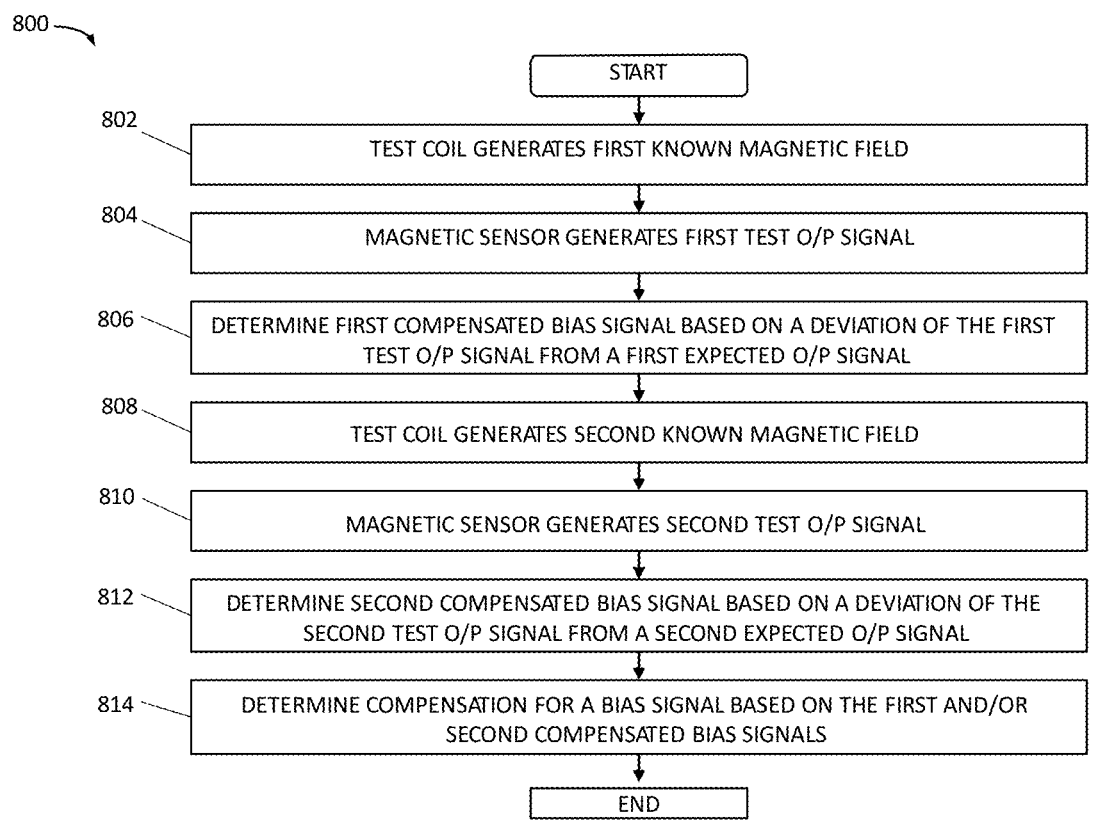
FIG. 8 is a flowchart of a method for calibrating a magnetic sensor by adjusting a bias signal applied to the sensor, according to some embodiments of the present disclosure.

FIG. 8 is a flowchart of a method 800 for calibrating a magnetic sensor by adjusting a bias signal applied to the sensor, according to some embodiments of the present disclosure. Various blocks of the method 800 will now be described with reference to the magnetic sensor system 300 shown in FIG. 3. However, in general, any magnetic sensor system, configured to perform blocks as described with reference to the method 800, in any order, is within the scope of the present disclosure. In some embodiments, the magnetic sensor system 300 may include, or be communicatively connected to, a controller which may control/enable implementation of various processes performed by the magnetic sensor system 300, e.g., various blocks of the method 800. Such a controller may be implemented as a processor, e.g. the processor 336 shown in FIG. 3, the processor 608 shown in FIG. 6, or the microcontroller 616 shown in FIG. 6. In the following description, such a controller will be referred to as, simply, a processor.

The method 800 may begin with a block 802, in which a test MFG generating a known magnetic field, which may be a first magnetic field if a plurality of known magnetic fields are to be generated sequentially. The block 802 may include a processor controlling that the test MFG 302 generates a known magnetic field, e.g., by controlling the amount of current provided to the test MFG 302 by the test MFG driver 304. In various embodiments, the test MFG generating a first known magnetic field in 802 may include any suitable device or circuit capable of generating known magnetic fields.

As the test MFG generates the first known magnetic field in 802, in 804 a magnetic sensor may be configured to generate an output (o/p) signal which may be referred to as a "test output signal" or a "first test output signal" to indicate that this is the output signal indicative of the first magnetic field generated by the test MFG. The block 804 may include a processor controlling that the Wheatstone bridge described with reference to FIG. 3 generates an output signal 330 while the test MFG 302 is generating the first known magnetic field. Because the test MFG 302 is positioned relatively close to the magnetic sensor, the output signal 330 generated by the sensor is indicative of the first known magnetic field generated by the test MFG 302.

Because the magnetic field generated by the test MFG 302 in 802 is known, the output signal 330 generated at 804 can be predicted/expected. The method 800 may then proceed with a processor comparing the output signal 330 that was actually generated at 804 to an expected output signal. Namely, the expected output signal is an output signal that a magnetic sensor is expected to generate given the known design and operational parameters of the magnetic sensor (e.g., design parameters may be the number of magnetic sensing elements included in a sensor, resistor values of different magnetic sensing elements, etc.; while operational parameters may include the bias signal applied to the magnetic sensor when the magnetic sensor generates said output signal). In an ideal scenario, the output signal generated at 804 would be equal to the expected output signal. However, in a real-life scenario, the output signal generated at 804 could deviate from the expected output signal because of various factors that may affect sensitivity of the sensor. As shown in FIG. 8, in block 806, the processor may be configured to determine a deviation of the first test output signal generated in 804 from the first expected output signal, and, based on the deviation, determine how/whether to compensate the bias signal applied to the magnetic sensor so that the magnetic sensor would generate the expected output signal when said first known magnetic field is applied thereto.

In some embodiments, calibration of the magnetic sensor may proceed from the block 806 directly to a block 814 where the processor would determine, based on the first compensated bias signal determined in 806, compensation to be applied to a bias signal which is to be applied to the magnetic sensor to measure unknown magnetic fields. After that, the magnetic sensor may be said to be calibrated in that said compensated bias signal may be applied to the magnetic sensor to perform sensor measurements of unknown magnetic fields, e.g., for contactless current measurements as described herein.

In other embodiments, calibration of the magnetic sensor may continue in that the process of blocks 802-806 is repeated again, but for different operating conditions, as shown in FIG. 8 with blocks 808, 810, and 812 (i.e., steps 808, 810, and 812 are similar to steps 802, 804, and 806, described above, but for different operating conditions). For example, in some embodiments, the different operating conditions may be that the temperature of, or in the vicinity of, the magnetic sensor is different when the magnetic sensor performs measurements to generate output signals in 804 and in 810. Thus, in block 808, the test MFG 302 may generate a second known magnetic field, which may be the same or different from the first known magnetic field generated in 802, and, in block 810, the magnetic sensor may generate a second test output signal, which may be generated with the same or different bias signal is applied to the magnetic sensor in 804, but where the magnetic sensor may be at a certain second temperature, different from the first temperature at which the magnetic sensor was in 804. In block 812, the processor may determine second compensated bias signal based on the deviation of the second test output signal generated by the sensor in 810 from the output signal which is expected to be generated by the sensor in these conditions (i.e., the second expected output signal).

In some embodiments, the operations of blocks 802-806 may be repeated more than two times shown in FIG. 8, e.g., in order to obtain more data points for compensating the bias signal for sensor measurements of unknown fields. The calibration of the method 800 may conclude with the block 814 in which the processor may determine compensation to be applied to a bias signal to be applied to the magnetic sensor to measure an unknown magnetic field based on one or more of the first, second, and possibly further, compensated bias signals determines in blocks 806, 812, and further analogous blocks if more test MFG measurements have been performed.

In some embodiments, determining the compensation in block 814 may include comparing operating conditions of the magnetic sensor for measuring unknown magnetic field to those which were present when the first and/or second compensated bias signals were determined in blocks 806 and 812. For example, considering that the first compensated bias signal was determined in 806 for the first test output signal that was generated in 804 when the magnetic sensor was at a first temperature T1 and that the second compensated bias signal was determined in 812 for the second test output signal that was generated in 810 when the magnetic sensor was at a second temperature T2, different from T1, block 814 may include the processor determining which bias signal is to be applied to the magnetic sensor for measuring an unknown magnetic field based on a temperature Tm (where "m" stands for "measurement") of the magnetic sensor during said measurement. In some embodiments, the processor may be configured to determine the compensated bias signal in 814 based on a function, e.g., a linear interpolation, a polynomial, extrapolation, and so on, of the first compensation bias signal/value determined in 806 and the second compensation bias signal/value determined in 812 over a temperature range that includes the first temperature T1, the second temperature T2, and the temperature Tm at the time when the magnetic sensor may generate the measurement output signal.

Calibration techniques described with reference to FIG. 8 may be used to calibrate any MR sensors, i.e., sensors configured to measure the magnetic field based on the change in resistivity that is proportional to the magnetic field. Examples of such sensors include, but are not limited to, AMR sensors, GMR sensors, TMR sensors, CMR sensors, and EMR sensors.

Magnetic Sensors in Flexible Housing

Turning to another aspect of a current measurement system presented herein, a range of clamp meters can contactlessly measure current flow in a wire positioned inside a jaw. The jaw may include a MFG wound around a magnetic core that can concentrate the magnetic field generated from the current flow in a wire and a hall effect sensor that converts the magnetic field into an output voltage that is proportional to the current flow in the wire. In some implementations, the jaw may be fairly thick, and the size of the opening may be limited. Thus, positioning a current measuring device inside tight places or other constrained areas may be challenging or impossible.

Certain embodiments can address the above problems by including a flexible current probe that can more easily be positioned around a wire located in physically constrained area. In some embodiments, such a flexible current probe may be included in the magnetic sensor system as shown in FIG. 3, which may, but does not have to include the test MFG 302 and the test MFG driver 304 described above. Some flexible current probes may include a Rogowski MFG technology to measure alternating current (AC) currents up to 2500 Amperes (A). A Rogowski MFG is a helical MFG of wire that is designed to measure AC current.

Certain embodiments disclosed herein include a flexible current probe that is capable of making both AC and DC current measurements up to 100 A, 200 A, 500 A, 1000 A, 2000 A, 2500 A, or more, or any range between the foregoing currents. Embodiments disclosed herein include a flexible current probe that uses a flexible circuit board or other flexible substrate that is capable of supporting one or more magnetic sensors. The flexible substrates discussed herein can be flexible while still being sufficiently rigid such that magnetic sensors can remain soldered or otherwise attached thereto even when the flexible substrate is being flexed.

Embodiments disclosed herein may use MR sensors, e.g., AMR sensors, to sense the magnetic field strength in a given direction with respect to the internal magnetization of the sensor. As described herein, sets of sensors may be configured in a Wheatstone bridge that can create a magnetic field sensor circuit whose output voltage is proportional to the magnetic field strength in a given direction. Magnetic sensor circuits like AMR sensor circuits can be positioned in a circular or substantially circular arrangement to contactlessly measure current in a single conductor cable or wire. Errors due, for example, to a positioning of the wire within a target measurement area located within the circle of magnetic sensors can be minimized by increasing the number of sensors or sensor circuits positioned around the target measurement area and using averaging techniques to measure the current flow in the conductor cable or wire.

Although this disclosure may discuss creating a flexible current probe enabling the measurement of both AC and DC current in wires located in physically constrained areas, it should be understood that certain embodiments disclosed herein can be used with non-flexible clamp meters, such as the clamp or jaw. Advantageously, in certain embodiments, by using embodiments disclosed herein, the profile or housing of the clamp/jaw can be substantially thinned enabling current measurement of wires in some physically constrained areas or of wires that are close to other sources of magnetic fields, such as a neighboring wire.

The magnetic sensors can be AMR sensors, e.g., of the magnetic sensor system as shown in FIG. 3, which may, but does not have to include the test MFG 302 and the test MFG driver 304 described above. Such AMR sensors can be arranged in a circular arrangement on a PCB to deliver a relatively thin profile (e.g., <5 mm) jaw solution for measuring DC and AC currents up to 200 A, or more. Further, the use of the flexible current probe described herein may enable measurement of wires in physically constrained areas that cannot easily be measured using the traditional jaw or a thinner version of the jaw enabled by the disclosure herein.

As mentioned above, embodiments disclosed herein enable a flexible current probe similar to ones that use a Rogowski MFG, but unlike the Rogowski MFG based probes, the flexible current probe described herein can measure both AC and DC currents up to 1000 A, 2000 A, 2500 A, or more, or any range between the foregoing currents, using an array of AMR sensors. Magnetic sensors, such as AMR sensors, can sense the magnetic field strength in a given direction in relation to their internal magnetization. Embodiments of flexible housing disclosed herein are not limited to AMR sensors and can use others types of sensors including, but not limited to, giant magnetoresistive (GMR) sensors, tunnel magnetoresistive (TMR) sensors, colossal magnetoresistive (CMR) sensors, and extraordinary magnetoresistive (EMR) sensors. Magnetoresistive (xMR) sensors can include any suitable sensor that has a resistance that changes in response to a magnetic field. In certain embodiments of using flexible housing as disclosed herein, Hall Effect sensors or Flux Gate sensors can be used with the calculations disclosed herein to determine current flow in a wire. The sensors can be used in a current measurement apparatus to measure the current in a wire, e.g., as described above.

To enable flexibility, the magnetic sensors can be soldered or otherwise attached on a flexible circuit material like the Dupont™ Pyralux® AP, which can be used for multilayer rigid flex applications. Other flexible materials, circuits boards, and/or substrates may be used with embodiments disclosed herein.

Figure 9:
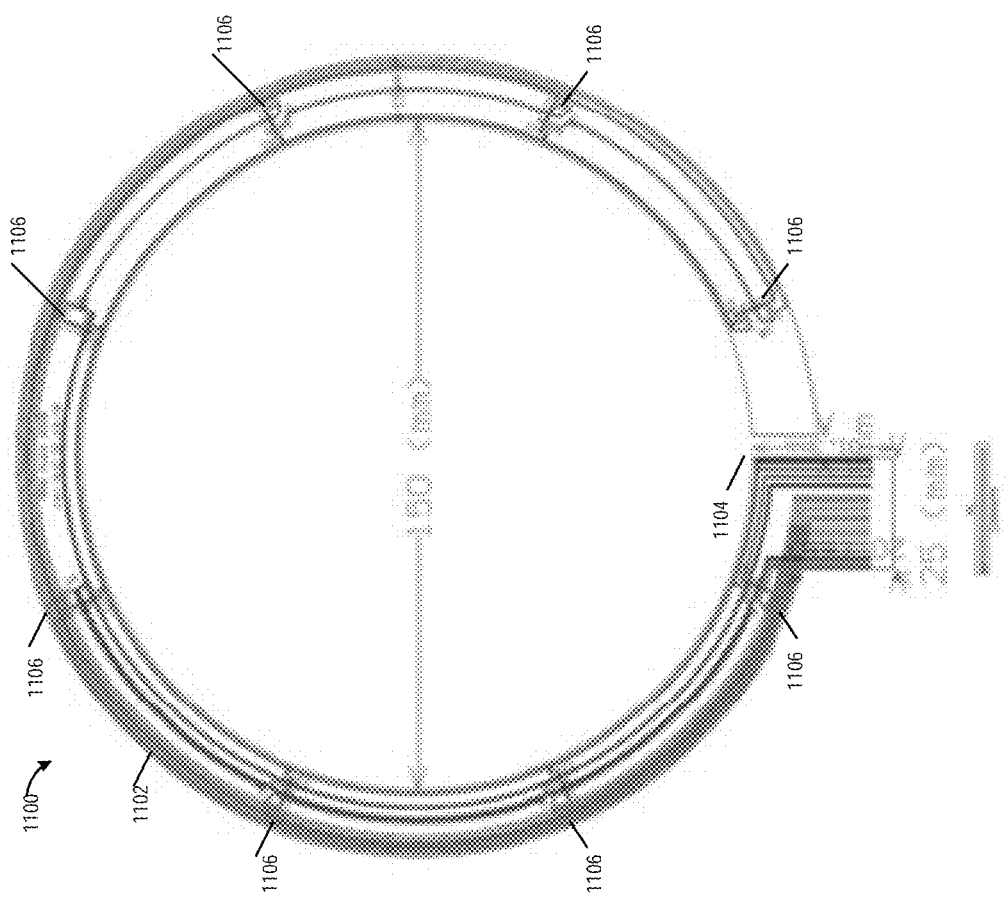
FIG. 9 illustrates a flexible current probe that includes magnetic sensors, according to some embodiments of the present disclosure.

FIG. 9 illustrates an example of a flexible current probe 1100 that includes magnetic sensors in accordance with certain embodiments. The flexible current probe 1100 illustrated in FIG. 9 includes a flexible material 1102 that can form a circular or substantially circular ring. This flexible material 1102 may be or may include a flexible PCB. The illustrated embodiment has a 15 mm thickness and forms a circle or substantially circular ring with a diameter of 150 mm. Other dimensions are possible and can be implemented in various applications. For example, it is possible to create a ring with a diameter of 50 mm 100 mm, 200 mm, 250 mm, or 1 m, any range between the foregoing, or larger. In certain embodiments, creating a larger ring may include adding more sensors to the flexible current probe. Further, it should be understood that because, for example, a flexible material is used to create a flexible current probe, it is possible for the flexible current probe 1100 to be configured in non-circular shapes either when in use or not when in use. For example, the flexible current probe 1100 may be formed as an oval with a particular set of dimensions and may be reshaped as an oval with different dimensions or as a circle. In some cases, the flexible current probe 1100 may be reshaped as it is positioned around a wire based on the location of the wire with respect to other objects, such as a wall, machinery, or other wires. As illustrated in FIG. 9, the flexible current probe 1100 may include an opening 1104 that enables a user to open the arc or loop formed by the flexible current probe and to place the loop around the wire to be measured. The loop can be left open at the opening 1104 or the loop can be closed after it is placed around the wire to complete the circle or loop. As an electrical connection may not be completed, it is possible for the loop to remain open in some embodiments.

In certain embodiments, the magnetic sensors 1106 may be placed uniformly around the circle or loop formed by the flexible material 1102. Because, in certain embodiments, the flexible current probe 1100 can be made wider (e.g., 150 mm or more) than a non-flexible jaw, it is possible for the flexible current probe 1100 to measure higher current values, such as currents up to 2500 amps of both AC and DC current. When the wire is relatively close to some of the magnetic sensors, the sensors can over-range or saturate causing the current measurement to be inaccurate. The example embodiments illustrated in FIGS. 10A and 10B and FIGS. 11A and 11B can improve on the saturation issue that can sometimes occur when the wire is positioned too close to some of the magnetic sensors.

FIGS. 10A and 10B illustrate an example placement of sensors within an example apparatus for measuring current in accordance with certain embodiments. In the embodiments illustrated in FIGS. 10A and 10B, and as illustrated by the different orientations of the sensors 1202 and 1204, the magnetic sensors, e.g., AMR sensors, can be positioned in pairs with magnetic sensors configured to measure magnetic field strength in an X-coordinate direction placed on one side (e.g., the top) of the flex material and with magnetic sensors configured to measure magnetic field strength in a Y-coordinate direction placed on the opposite side (e.g., the bottom) of the flex material. Positioning some of the sensors on opposite sides of the flex circuit enables each pair of sensors to be further apart from each other reducing the possibility that the wire is placed close to one or more of the sensors causing the one or more sensors to be over range or to saturate. The output of the sensors can be used to calculate the current flow in the wire as described below.

FIGS. 11A and 11B illustrate an example placement of sensors within an alternative example apparatus for measuring current in accordance with certain embodiments. In the embodiments illustrated in FIGS. 11A and 11B, additional sensors can be positioned around the flexible current probe 1302. For example, instead of having 8 sensors (four on top and four on the bottom) as illustrated in FIGS. 10A and 10B, 16 sensors (eight on top and eight on the bottom) can be positioned around the flexible current probe 1302 with eight sensors configured to measure a strength of the magnetic field in the X-coordinate direction and eight sensors configured to measure a strength of the magnetic field in the Y-coordinate direction. In each of the embodiments, the wire to be measured may be positioned within a target measurement area within the circle area formed by the flexible current probe with the wire extending along a z-coordinate direction that points out of the viewing sheet towards a viewer of the drawing sheet. Because, for example, the combination of the flex circuit and magnetic sensors can be made thinner than existing current measuring devices, it is possible to include more sensors than necessary to measure the current flow in a wire. Thus, by including additional magnetic sensors, it is possible to detect sensors that are saturated due, for example, to the wire being measured being too close the sensor and to discard the measurements from the saturated sensors while having a sufficient number of field strength measurements from other sensors included on the flexible current probe 1302 to determine a current flow in the wire being measured.

As previously described, embodiments disclosed herein may use magnetic sensors such as AMR sensors to measure current flow in a cable or wire. In measuring the current flow in the wire, there are a number of variables whose values are to be determined by the processor. For a single wire, there may be up to five variables for which to solve. The variables include the x and y position of the wire or conductor, the current flowing through the wire, and the background magnetic field in the x and y directions. The background magnetic field may be due to Earth's magnetic field and/or a field from a wire that is nearby to the current measurement apparatus. To determine the values of the five variables, it is desirable to develop a configuration for the placement of the AMR sensors in a defined fashion that yields the optimal field solving solution. One such non-limiting configuration is to position the sensors as illustrated in FIGS. 11A and 11B with eight magnetic sensors positioned in a circular fashion on the top of the PCB to measure the magnetic field strength in the X direction and with another eight magnetic sensors placed at the exact same location as the first eight sensors, but at the bottom of the PCB and oriented to measure the magnetic field strength in the Y direction. This configuration yields 16 data points for eight x, y locations associated with 8 pairs of sensors where we can measure the magnetic field strength fully. In some embodiments, the location of the sensors for measuring the x-component of the magnetic field and the location of the sensors for measuring the y-component of the magnetic field may differ from each other. Advantageously, because there are 16 measurements obtained from the sixteen total sensors to solve for five variables, it is possible to drop some of the measurements obtained from sensors that have saturated while still accurately determining the value of the variables.

In certain embodiments disclosed herein, the sensor circuits can be positioned symmetrically on the flexible PCB or symmetrically around a target measurement area. In other embodiments, the sensor circuits may be positioned at various locations to improve or maximize the accuracy of the sensor measurements. In certain embodiments, the sensor circuits can be positioned using any suitable principles and advantages described in application Ser. No. 15/812,849, which was filed on Nov. 14, 2017 and is titled "CURRENT MEASURING APPARATUS AND METHODS," the disclosure of which is hereby incorporated by reference in its entirety herein. In other embodiments, the sensor circuits can be positioned using any suitable principles and advantages described in U.S. application Ser. No. 16/003,701, which was filed on Jun. 8, 2018 and is titled "CONTACTLESS CURRENT MEASUREMENT USING MAGNETIC SENSORS," the disclosure of which is also hereby incorporated by reference in its entirety herein.

Sixteen magnetic field measurements may be obtain from the two sets of eight sensor circuits. Each of the sixteen magnetic field measurements can be a non-linear function of the five variables mentioned earlier for a wire (e.g., the x, y location of the wire, the current flow within the wire, and the background magnetic field in the x and y directions). Each of the sixteen magnetic sensors can be used with an analog front-end and an ADC to transmit the field measurements to a processor, such as a microcontroller, that converts the analog information to a digital word. The ADC can sample the magnetic sensor output at a relatively fast rate to provide a continuous stream of data from each sensor or sensor circuit to the microcontroller. In certain embodiments, non-linear least square solving techniques can be used to extract the values for the five variables from the sixteen magnetic field strength measurements. Moreover, in certain embodiments, a successive approximation method can be used to minimize the error between the sixteen measurements for the field strengths and a set of predicted field strengths that are predicted based on a predicted x, y location of the wire, a predicted current flow of the wire, and the background fields.

A number of different non-linear least square fit processes can be used to derive the solution and determine values for the variables. One metric is to utilize the least number of time steps to achieve the smallest error and converge quickly. One method that can be used to derive the solution is the Steepest Descent Method, which typically has very good performance in the first few iterative steps, but its final settling is linear and slow. Another method that may be used is the Newton Method, which is typically very good in the final stages of the iterative process when the predicted value is close to the solution. Another possible approach is to use a hybrid operation that can initially use the Steepest Descent method and then use the Newton method when close to final settling. The challenge with such hybrid operations is to develop robust switch over operations that are not overly computational complex. Other embodiments can use versions of the Levenberg-Marquardt method and the Powell's Dog Leg method, or versions of the damped Gauss-Newton method for solving non-linear least square problems. These methods are often considered as the best methods for solving non-linear least square fit problems with the fastest convergence times for such applications.

Figure 12:
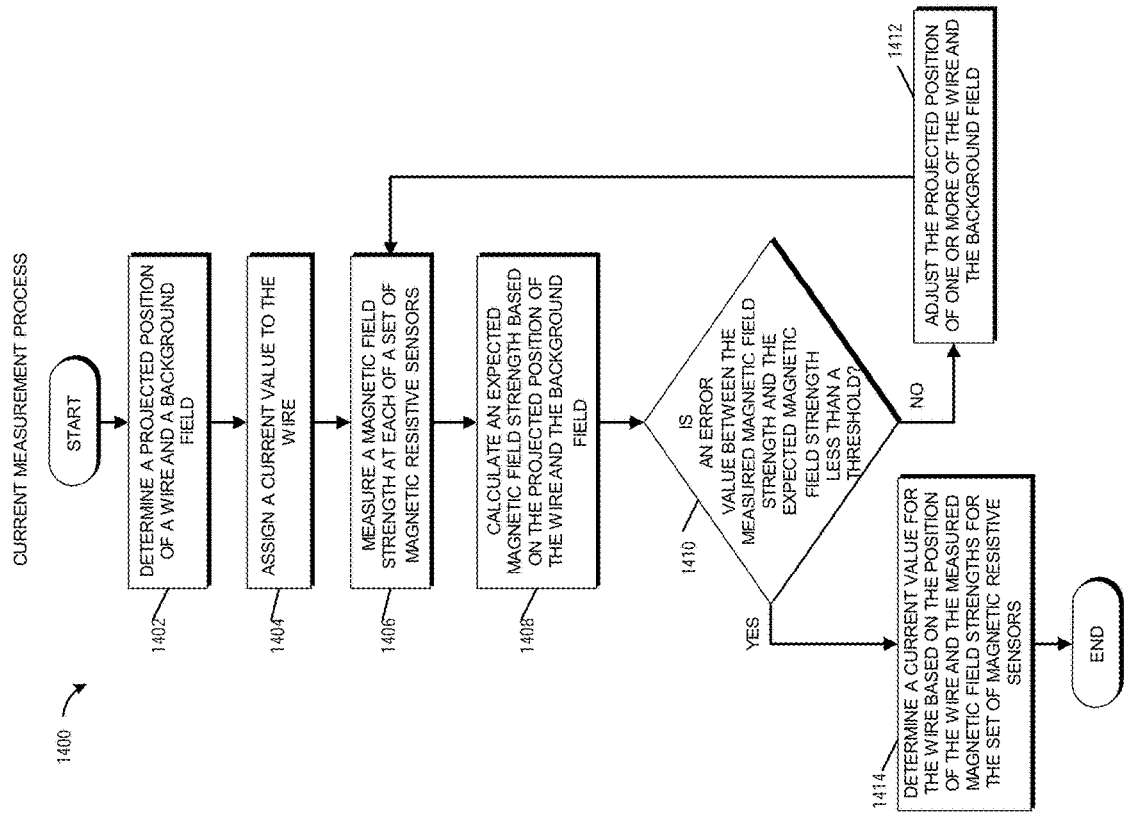
FIG. 12 is a flowchart of an example current measurement process, according to some embodiments of the present disclosure.

FIG. 12 presents a flowchart of an example current measurement process 1400 in accordance with certain embodiments. Some or all of the process 1400 can be implemented by any computing system that can measure current within a wire. The process 1400, in whole or in part, can be implemented by, for example, the current measuring unit 604, the sensors 606, the microcontroller 616, or the processor 608, as shown in FIG. 6, to name a few. Although a number of different systems can perform some or all of the process 1400, to simplify discussion, the process 1400 will be described with respect to particular systems.

The process 1400 may begin at block 1402 where, for example, the microcontroller 616 may determine a projected position of a wire and a background field. In some embodiments, the initial projected position of the wire may be the center of a target measurement area of a current measurement apparatus.

At block 1404, the microcontroller 616 may assign a current value to the wire. For example, the current assigned to the first wire may be one amp (1 A).

At block 1406, the microcontroller 616, using the sensors 606, may measure a magnetic field strength at each of the set of magnetic resistive sensors. In certain embodiments, a pair of sensors 606 may be used to determine an x, y magnetic field strength at a particular location. The magnetic resistive sensors may be AMR, GMR, TMR or other magnetic sensors. In certain embodiments, the block 1406 may include determining whether any of the sensors 606 are saturated or over range. If it is determined that one or more sensors 606 are saturated, the measured magnetic field strength measured by the saturated sensor may be ignored in performing the remainder of the process 1400. In some instances, it is possible that a sensor 606 that is saturated, or is operating in a saturated region, ceases to be saturated or to operate in the saturated region. For example, if a wire is close to a sensor 606 it may become saturated, but if the user moves the flexible current probe such that the wire is no longer close to the sensor 606, it may cease to be operating in the saturated region. In some such cases, if it is later determined that a previously saturated sensor 606 is no longer saturated, measurements obtained by the previously saturated sensor 606 may again be considered in performing the process 1400. Similarly, in some embodiments, if a sensor 606 that was not operating in the saturated region becomes saturated, the measurements obtained by the now saturated sensor 606 may be ignored or discarded.

At block 1408, the microcontroller 616 may calculate an expected magnetic field strength at each sensor based on the projected position of the wire and the background field. Further, the block 1408 may involve calculating the expected magnetic field strength based on the assigned current value assigned at the block 1404 for current flowing through the wire. As a hypothetical current and a position are assigned to the wire, it is possible to determine an expected magnetic field strength to be measured by each sensor. If the hypothetical current and position of the wire matches the actual current flowing through the wire and the actual position of the wire, the calculated or expected magnetic field strength should match the measured field strength determined at the block 1406. A difference between the measured and expected magnetic field strengths of each sensor may be determined as an error value. In some embodiments, a separate error value may be calculated for the magnetic field strength measured at each magnetic resistive sensor. In other embodiments, an aggregate error value, or an error value that reflects the total error of the magnetic field strength is determined by, for example, taking a differential between the calculated expected magnetic field strength and the measured magnetic field strength of the set of magnetic resistive sensors.

At decision block 1410, the microcontroller 616 may determine whether an error value between the measured magnetic field strengths and the expected magnetic field strengths is less than a threshold. The threshold may be set by a user or by a manufacturer of the current measurement apparatus. In certain embodiments, the decision block 1410 involves determining whether the error value is at a minima or minimum point. Because the current assigned to the wire as part of the block 1404 may not match the actual current in the wire, it may not be possible to obtain an error that satisfies the threshold. However, by determining the point where the error is at a minimum, the location of the wire within the target measurement area can be determined. Once the location of the wire is determined within the target measurement area, the current flowing through the wire can be determined based at least in part on the strength of the magnetic field measured at the location of the wire. In some embodiments, determining whether the error value is less than a threshold may include determining a root mean square sum of errors measured between the output of the sensors and the expected output of the sensors. It can then be determined whether the root mean square sum is less than, or satisfies, the threshold.

If it is determined at the decision block 1410 that the error value is not less than the threshold or does not satisfy a threshold, the process 1400 may proceed to the block 1412. At the block 1412, the microcontroller 616 may adjust the projected position of one or more of the wire or the background field. The process may then return to the block 1406 where the magnetic field strength at each of the set of magnetic resistive sensors is again measured. At the block 1408, the expected magnetic field strength may be recalculated based on the updated projected position of one or more of the wire and the background field. Advantageously, in certain embodiments, by repeating the process associated with the block 1406, movement of the current measurement apparatus, for example due to shaking or other movement of the operator's hand, during the measurement process can be accounted for in the determination of the current within the wire. Alternatively, in certain embodiments, the process 1400 may proceed from the block 1412 to the block 1408. In some such embodiments, the measured magnetic field strength previously obtained during performance of the process 1400 may be used during performance of the decision block 1410.

If it is determined at the decision block 1410 that the error value is less than the threshold or does satisfy a threshold, the process 1400 may proceed to the block 1414. At the block 1414, the microcontroller 616 may determine a current value for the wire based at least in part on the position of the wire and the measured magnetic field strengths for the set of magnetic resistive sensors. In certain embodiments, determining the current value for the wire may include repeating a modified version of the process 1400 using the known location, as determined using embodiments of the process 1400, of the wire within the target measurement area while varying the current value applied to the wire. Upon determining the current value that provides the minimum error, the current value may be displayed to a user on a display 612 of the current measurement apparatus 602.

Select Examples

Example A1 provides an apparatus for magnetic sensor mode detection, the apparatus comprising: a magnetic sensor configured to provide an output indicative of magnetic field strength; a test MFG configured to generate a magnetic field; and a processor configured to determine a mode of operation of the magnetic sensor based at least in part on the output generated by the magnetic sensor in response to the magnetic field generated by the test MFG.

Example A2 provides the apparatus of example A1, further comprising a test MFG driver configured to supply a current to the test MFG to generate the magnetic field.

Example A3 provides the apparatus of example A2, wherein the test MFG driver is further configured to supply a plurality of different currents to the test MFG to determine a plurality of sensitivity measurements for the magnetic sensor.

Example A4 provides the apparatus of example A3, wherein the processor is further configured to determine a linearity calibration to calibrate the magnetic sensor based at least in part on the plurality of sensitivity measurements for the magnetic sensor.

Example A5 provides the apparatus of example A4, wherein the processor is further configured to calibrate the magnetic sensor when the apparatus is initiated or when a calibration mode of the apparatus is initiated.

Example A6 provides the apparatus of example A2, wherein the test MFG circuit further comprises a switch configured to modify a phase of the magnetic field by modifying a direction of the current supplied to the test MFG.

Example A7 provides the apparatus of example A2, wherein the test MFG driver further comprises an amplifier configured to receive a reference voltage and a zero TC resistor in electrical communication with the amplifier.

Example A8 provides the apparatus of example A7, wherein the amplifier is configured to drive the reference voltage across the zero TC resistor to create the current supplied to the test MFG.

Example A9 provides the apparatus of example A1, wherein the magnetic sensor comprises an anisotropic magnetoresistive sensor.

Example A10 provides the apparatus of example A1, wherein the processor is configured to intermittently determine the mode of operation of the magnetic sensor.

Example A11 provides the apparatus of example A1, further comprising a display, wherein the processor is further configured to output an indication to the display when the magnetic sensor is operating in a saturation mode.

Example A12 provides the apparatus of example A1, wherein the test MFG and the magnetic sensor are located on the same PCB.

Example A13 provides the apparatus of example A1, wherein the processor is further configured to determine the mode of operation of the magnetic sensor by performing a correlated double sampling process based at least in part on the output generated by the magnetic sensor in response to the magnetic field and a second output generated by the magnetic sensor in response to a second magnetic field generated by the test MFG.

Example A14 provides the apparatus of example A1, wherein the apparatus further comprises a housing comprising an opening configured to receive a wire whose current is to be measured when the processor determines that the mode of operation of the magnetic sensor is a linear mode.

Example A15 provides the apparatus of example A14, wherein the magnetic sensor is arranged in the housing with respect to the opening.

Example A16 provides the apparatus of example A1, wherein the mode of operation comprises one of a linear mode or a saturation mode.

Example A17 provides the apparatus with magnetic sensor sensitivity calibration, the apparatus comprising: a magnetic sensor configured to provide an output indicative of magnetic field strength; and processor in communication with the magnetic sensor, the processor configured to: determine calibration information to calibrate the sensor based at least in part on a sensitivity associated with the magnetic sensor; and cause the magnetic sensor to be calibrated based on the calibration information.

Example A18 provides the apparatus of examples A17, further comprising an MFG configured to generate a magnetic field detectable by the magnetic sensor.

Example A19 provides the apparatus of examples A18, wherein the sensitivity of the magnetic sensor is determined based at least in part on a set of magnetic field strength measurements of a set of magnetic fields generated by the MFG.

Example A20 provides the apparatus of examples A18, further comprising a magnetic field driver configured to cause the MFG to generate a particular magnetic field.

Example A21 provides the apparatus of examples A17, wherein the processor is further configured to determine a mode of operation of the magnetic sensor.

Example A22 provides the apparatus of examples A21, wherein the processor determined the mode of operation of the magnetic sensor based at least in part on the sensitivity of the magnetic sensor.

Example A23 of identifying an operating mode of a magnetic sensor, the method comprising: generating a sensitivity profile for a magnetic sensor using a test MFG positioned within a threshold distance from the magnetic sensor; determining a sensitivity value for the magnetic sensor using the test MFG; and identifying a mode of operation of the magnetic sensor based on the sensitivity value and the sensitivity profile.

Example A24 provides the apparatus of examples A23, wherein generating the sensitivity profile comprises: supplying a first current to the test MFG to generate a first magnetic field; obtaining a first magnetic field strength measurement from the magnetic sensor when the first current is supplied to the test MFG; supplying a second current to the test MFG to generate a second magnetic field, wherein the second current differs from the first current; obtaining a second magnetic field strength measurement from the magnetic sensor; determining a first delta corresponding to a difference between the first magnetic field strength measurement and the second magnetic field strength measurement; determining a second delta corresponding to a difference between the first magnetic field and the second magnetic field; and determining the sensitivity profile based on the ratio of the first delta and the second delta.

Example A25 provides the apparatus of examples A23, wherein determining the sensitivity value for the magnetic sensor comprises: supplying a first current to the test MFG to generate a first magnetic field; obtaining a first magnetic field strength measurement from the magnetic sensor, wherein the first magnetic field strength comprises a combination of a measurement of the first magnetic field and a measurement of an unknown magnetic field generated by an unknown current flowing through a wire being measured by a current measurement apparatus that includes the magnetic sensor; supplying a second current to the test MFG to generate a second magnetic field, wherein the second current is of the same magnitude as the first current but flows in the opposite direction of the first current across the test MFG causing the second magnetic field to be of opposite phase as the first magnetic field, but of the same magnitude; obtaining a second magnetic field strength measurement from the magnetic sensor, wherein the second magnetic field strength comprises a combination of a measurement of the second magnetic field and the measurement of the unknown magnetic field generated by the unknown current flowing through the wire being measured by the current measurement apparatus that includes the magnetic sensor; subtracting the first magnetic field strength from the second magnetic field strength to cancel a contribution of the unknown magnetic field to the first magnetic field strength and to determine a test MFG field strength corresponding to the first magnetic field; and determining the sensitivity value for the magnetic sensor based at least in part on the test MFG field strength and the first magnetic field.

Example A26 provides the apparatus of examples A23, wherein identifying the mode of operation of the magnetic sensor comprises determining whether the sensitivity value satisfies a sensitivity value threshold.

Example A27 provides the apparatus of examples A23, further comprising outputting an error indication on a display when determining that the magnetic sensor is operating in a saturated mode.

Example A28 provides the apparatus of examples A23, further comprising: supplying a plurality of different currents to the test MFG to determine a plurality of sensitivity measurements for the magnetic sensor; determining a linearity calibration to calibrate the magnetic sensor based at least in part on the plurality of sensitivity measurements for the magnetic sensor; and applying the linearity calibration to one or more output values obtained from the magnetic sensor.

Example A29 provides the apparatus of examples A23, wherein the magnetic sensor comprises an anisotropic magnetoresistive sensor.

Example B1 provides for measuring current flow in a wire, the apparatus comprising: an at least partially flexible housing comprising an opening configured to receive a wire; magnetic sensors arranged around the opening and configured to measure magnetic field strength; and a processor configured to determine current flowing through a wire based on outputs from the magnetic sensors.

Example B2 provides the apparatus of examples B1, further comprising a flexible circuit board disposed within the at least partially flexible housing.

Example B3 provides the apparatus of examples B2, wherein the magnetic sensors are disposed on the flexible circuit board.

Example B4 provides the apparatus of examples B2, wherein the magnetic sensors comprise: first magnetic sensors configured to measure the magnetic field strength in a first direction; and second magnetic sensors configured to measure the magnetic field strength in a second direction.

Example B5 provides the apparatus of examples B4, wherein the first magnetic sensors and the second magnetic sensors are disposed on opposite sides of the flexible circuit board.

Example B6 provides the apparatus of examples B4, wherein the first direction is substantially orthogonal to the second direction.

Example B7 provides the apparatus of examples B1, wherein the magnetic sensors comprise anisotropic magnetoresistive sensors.

Example B8 provides the apparatus of examples B1, wherein the magnetic sensors comprise a plurality of sensor circuits and each of the plurality of sensor circuits comprises a plurality of sensors.

Example B9 provides the apparatus of examples B8, wherein the plurality of sensors is configured as a Wheatstone bridge.

Example B10 provides the apparatus of examples B1, wherein the processor is configured to determine the current flowing through the wire based at least in part on a least square fit operation.

Example B11 provides the apparatus of examples B1, wherein the processor is configured to determine the current flowing through the wire based at least in part on a determination of one or more magnetic field strengths measured by at least some of the magnetic sensors and a determination of a location of the wire within a target measurement area.

Example B12 provides the apparatus of examples B1, wherein the processor is configured to determine a direct current flowing through the wire.

Example B13 provides the apparatus of examples B1, wherein the processor is configured to determine a direct current of up to at least 2500 Amperes flowing through the wire.

Example B14 provides the apparatus of examples B1, wherein the processor is configured to determine an AC flowing through the wire.

Example B15 for measuring current flow in a wire, the apparatus comprising: magnetic sensors disposed on a flexible material; and a processor configured to determine a direct current (DC) current of up to at least 200 Amperes flowing through a wire based on outputs of the magnetic sensors.

Example B16 provides the apparatus of examples B15, wherein the processor is configured to determine the DC current of up to at least 500 Amperes flowing through the wire based at least in part on outputs of the magnetic sensors.

Example B17 provides the apparatus of examples B15, wherein the processor is configured to determine the DC current of up to at least 1000 Amperes flowing through the wire based at least in part on outputs of the magnetic sensors.

Example B18 provides the apparatus of examples B15, wherein the processor is configured to determine an AC current flowing through the wire based at least in part on outputs of the magnetic sensors.

Example B19 provides the apparatus of examples B15, wherein the magnetic sensors are disposed around an opening configured to receive the wire.

Example B20 provides the apparatus of examples B15, wherein the magnetic sensors comprise anisotropic magnetoresistive sensors.

Example B21 provides the apparatus of examples B15 further comprising a housing enclosing the magnetic sensors, the housing being flexible such that a shaped of an opening configured to receive the wire is adjustable.

Example B22 provides the apparatus for measuring current flow in a wire, the apparatus comprising: a housing comprising an opening configured to receive a wire; magnetic sensors within the housing; and a processor configured to determine a direct current (DC) current of up to at least 1000 Amperes flowing through the wire base on outputs of the magnetic sensors.

Example B23 provides the apparatus of examples B22, wherein the housing is flexible such that a shape of the opening is adjustable.

Example B24 provides the apparatus of examples B22, wherein the magnetic sensors are disposed on a flexible circuit board.

Example B25 provides the apparatus of examples B22, wherein the processor is configured to determine the DC current of up to at least 2000 Amperes flowing through the wire based at least in part on the outputs of the magnetic sensors.

Example B26 provides the apparatus of examples B22, wherein the processor is configured to determine an AC current flowing through the wire based on outputs of the magnetic sensors.

Example B27 provides the apparatus of examples B22, wherein the magnetic sensors comprise anisotropic magnetoresistive sensors.

Example B28 provides the apparatus of measuring current flowing through a wire, the method comprising: positioning a current probe around a wire such that magnetic sensors of the current probe are around the wire, the current probe comprising a flexible material on which the magnetic sensors are attached; and determining, using a processor of the current probe, a direct current (DC) current of more than 200 Amperes based on outputs of the magnetic sensors.

Example B29 provides the apparatus of examples B28, wherein the determining comprises measuring the DC current of at least 1000 Amperes.

Example B30 provides the apparatus of examples B28, wherein the determining comprises measuring the DC current in a range from 200 Amperes to 2500 Amperes.

Example B31 provides the apparatus of examples B28, further comprising determining, using the processor of the current probe, an AC current based on outputs of the magnetic sensors.

Example B32 provides the apparatus of examples B28, wherein the magnetic sensors comprise anisotropic magnetoresistive (AMR) sensors.

Example B33 provides the apparatus of examples B32, wherein the AMR sensors comprise a first group of AMR sensors configured to provide an indication of magnetic field strength in a first direction and a second group of AMR sensors configured to provide an indication of magnetic field strength in a second direction.

Example B34 provides the apparatus of examples B32, wherein the current probe comprises AMR sensors on opposing sides of the flexible material.

Example C1 provides apparatus for calibrating a magnetic sensor configured to generate an output signal indicative of magnetic field strength when an input signal (e.g., a bias signal) is applied to the magnetic sensor. The apparatus includes a test MFG and a processor. The test MFG is configured to generate magnetic fields, e.g. when currents are ran through the test MFG. The processor is configured to control the test MFG to generate a first known magnetic field, control the magnetic sensor to generate a first test output signal when the test MFG generates the first known magnetic field and a first input signal is applied to the magnetic sensor, determine a first compensation value for the first input signal based on a deviation of the first test output signal from a first expected output signal, where the first expected output signal is indicative of magnetic field strength of the first known magnetic field, and determine a compensated input signal to be applied to the magnetic sensor, where the compensated input signal is based on the first compensation value and on the first input signal.

Example C2 provides the apparatus according to example C1, where controlling the magnetic sensor to generate the first test output signal includes controlling the magnetic sensor to generate the first test output signal when the magnetic sensor is at a first temperature. In such an example, the processor is further configured to control the test MFG to generate a second known magnetic field, control the magnetic sensor to generate a second test output signal when the test MFG generates the second known magnetic field and a second input signal is applied to the magnetic sensor, and when the magnetic sensor is at a second temperature, and determine a second compensation value for the second input signal based on a deviation of the second test output signal from a second expected output signal, where the second expected output signal is indicative of magnetic field strength of the second known magnetic field. Furthermore, in such an example, the compensated input signal is further based on the second compensation value, the first temperature, and the second temperature, and further based on the second input signal.

Example C3 provides the apparatus according to example C2, where the second input signal and the first input signal are same.

Example C4 provides the apparatus according to examples C2 or 3, where the processor is further configured to control the magnetic sensor to generate a measurement output signal when the compensated input signal is applied to the magnetic sensor.

Example C5 provides the apparatus according to example C4, where the compensated input signal is further based on a temperature of the magnetic sensor at a time when the magnetic sensor generates the measurement output signal.

Example C6 provides the apparatus according to example C5, where the compensated input signal is based on a function (e.g., a linear interpolation, a polynomial, extrapolation, etc.) of the first compensation value and the second compensation value over a temperature range that includes the first temperature, the second temperature, and the temperature of the magnetic sensor at the time when the magnetic sensor generates the measurement output signal.

Example C7 provides the apparatus according to any one of examples C4-6, where the processor is further configured to determine a current through at least one wire based on the measurement output signal.

Example C8 provides the apparatus according to example C7, where the apparatus further includes a housing that includes an opening for receiving the at least one wire, and the magnetic sensor is arranged in the housing.

Example C9 provides the apparatus according to example C8, where the magnetic sensor is one of a plurality of magnetic sensors, and where the current through at least one wire is determined based on measurement output signals generated by different ones of the plurality of magnetic sensors.

Example C10 provides the apparatus according to examples C8 or 9, where the housing is an at least partially flexible housing.

Example C11 provides the apparatus according to example C10, further including a flexible circuit board disposed within the at least partially flexible housing, where the magnetic sensor is disposed on the flexible circuit board.

Example C12 provides the apparatus according to any one of the preceding examples C, where the magnetic sensor includes four magnetic sensing elements (e.g., magnetoresistive sensor elements) in a Wheatstone bridge configuration.

Example C13 provides the apparatus according to example C12, where the input signal is a bridge signal of the Wheatstone bridge (i.e., the highest input voltage/current signal applied to the bridge).

Example C14 provides the apparatus according to any one of the preceding examples C, where the input signal is based on at least one of a PTAT signal (either PTAT voltage or PTAT current signal), a CTAT signal (either CTAT voltage or CTAT current signal), or a ZTAT signal (either ZTAT voltage or ZTAT current signal). In various embodiments, the input signal being "based on" one of these signals could be that the input signal is that signal, a polynomial of that signal, etc.

Example C15 provides the apparatus according to any one of the preceding examples C, where the magnetic sensor is a magnetoresistive sensor, configured to measure the magnetic field based on the change in resistivity that is proportional to the perpendicular magnetic field. Examples of such sensors include giant magnetoresistive (GMR) sensors, tunnel magnetoresistive (TMR) sensors, colossal magnetoresistive (CMR) sensors, and extraordinary magnetoresistive (EMR) sensors.

Example C16 provides the apparatus according to any one of the preceding examples C, where the magnetic sensor is an anisotropic magnetoresistive (AMR) sensor.

Example C17 provides an apparatus for measuring current flow through at least one wire. The apparatus includes a housing including an opening for receiving the at least one wire; a magnetic sensor arranged within the housing; a test MFG configured to generate a magnetic field when a test current is run through the test MFG; and a processor that is at least partially implemented in hardware. The test MFG is configured to generate a known magnetic field, and the magnetic sensor is configured to generate a test output signal indicative of a magnetic field strength (which magnetic field strength is then indicative of the magnetic field generated by the test MFG) when a bias signal is applied to the magnetic sensor and the test MFG generates the known magnetic field. The processor is configured to determine a compensation to be applied to the bias signal based on a deviation of the test output signal from an expected output signal, where the expected output signal is indicative of an expected magnetic field strength of the known magnetic field. The processor is also configured to derive a measure of a current in the at least one wire based on a measurement output signal generated by the magnetic sensor, where the magnetic sensor is configured to generate the measurement output signal when the bias signal with the compensation applied thereto is applied to the magnetic sensor and when the at least one wire extends through the opening of the housing (thus, the measurement output signal is indicative of a magnetic field that is generated if a current is run through the at least one wire).

Example C18 provides the apparatus according to example C17, where the magnetic sensor includes a plurality of magnetoresistive sensor elements arranged in a Wheatstone bridge configuration.

In further examples C, the apparatus according to examples C17 or 18 further includes any features of the apparatus according to any one of example C1-16, and vice versa.

Example C19 provides a method of operating an apparatus including a test MFG configured to generate known magnetic fields and further including a housing with an opening for receiving the at least one wire and a magnetic sensor arranged within the housing, the magnetic sensor configured to generate output signals indicative of magnetic field strengths of magnetic fields in a vicinity of the magnetic sensor. The method includes controlling the test MFG to generate a first known magnetic field; controlling the magnetic sensor to generate a first test output signal when the test MFG generates the first known magnetic field and a first bias signal is applied to the magnetic sensor; based on a deviation of the first test output signal from a first expected output signal, determining a first compensated bias signal, where the first expected output signal is indicative of an expected magnetic field strength of the first known magnetic field when the first bias signal is applied to the magnetic sensor, and where the first compensated bias signal is the first bias signal compensated to reduce the deviation of the first test output signal from the first expected output signal; controlling the magnetic sensor to generate a measurement output signal when a compensated bias signal is applied to the magnetic sensor and when the at least one wire extends through the opening of the housing, where the compensated bias signal is based on the first compensated bias signal; and deriving a measure of a current in the at least one wire based on the measurement output signal.

Example C20 provides the method according to example C19, where controlling the magnetic sensor to generate the first test output signal includes controlling the magnetic sensor to generate the first test output signal when the magnetic sensor is at a first temperature, the first expected output signal is indicative of the expected magnetic field strength of the first known magnetic field when the first bias signal is applied to the magnetic sensor and the magnetic sensor is at the first temperature, and the compensated bias signal is further based on the first temperature.

Example C21 provides the method according to example C20, further including controlling the test MFG to generate a second known magnetic field; controlling the magnetic sensor to generate a second test output signal when the test MFG generates the second known magnetic field, a second bias signal is applied to the magnetic sensor, and the magnetic sensor is at a second temperature; and based on a deviation of the second test output signal from a second expected output signal, determining a second compensated bias signal, where the second expected output signal is indicative of an expected magnetic field strength of the second known magnetic field when the second bias signal is applied to the magnetic sensor and the magnetic sensor is at the second temperature, and when the second compensated bias signal is the second bias signal compensated to reduce the deviation of the second test output signal from the second expected output signal, where the compensated bias signal is further based on the second compensated bias signal and the second temperature.

Example C22 provides the method according to example C21, further including determining the compensated bias signal based on a temperature of the magnetic sensor when the magnetic sensor is to generate the measurement output and based on an interpolation and/or an extrapolation of the first compensated bias signal and the second compensated bias signal in relation to the first temperature and the second temperature.

Example C23 provides the method according to example C22, where determining the compensated bias signal includes determining a bias signal corresponding to the temperature of the magnetic sensor when the magnetic sensor is to generate the measurement output from a curve representing relationship between bias signals and temperatures, the curve generated based on the interpolation and/or the extrapolation of the first compensated bias signal and the second compensated bias signal in relation to the first temperature and the second temperature.

Example C24 provides the method according to any one of examples C21-23, further including storing in memory information indicative of the first temperature, the first compensated bias signal, the second temperature, and the second compensated bias signal.

Variations and Implementations

Some or all of any the processes described herein may be embodied in, and fully automated via, software code modules executed by a computing system that includes one or more computers or processors. The code modules may be stored in any type of non-transitory computer-readable medium or other computer storage device. Some or all the methods may be embodied in specialized computer hardware.

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

The various illustrative logical blocks and modules described in connection with the embodiments disclosed herein can be implemented or performed by a machine, such as a processing unit or processor, a digital signal processor (DSP), an application-specific integrated circuit (ASIC), a FPGA or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can include electrical circuitry configured to process computer-executable instructions. In another embodiment, a processor includes an FPGA or other programmable device that performs logic operations without processing computer-executable instructions. A processor can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor may also include primarily analog components. For example, some or all of the signal processing algorithms described herein may be implemented in analog circuitry or mixed analog and digital circuitry. A computing environment can include any type of computer system, including, but not limited to, a computer system based on a microprocessor, a mainframe computer, a DSP, a portable computing device, a device controller, or a computational engine within an appliance, to name a few.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Any process descriptions, elements or blocks in the flow diagrams described herein and/or depicted in the attached FIGS. should be understood as potentially representing modules, segments, or portions of code which include one or more executable instructions for implementing specific logical functions or elements in the process. Alternate implementations are included within the scope of the embodiments described herein in which elements or functions may be deleted, executed out of order from that shown, or discussed, including substantially concurrently or in reverse order, depending on the functionality involved as would be understood by those skilled in the art.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

The invention claimed is:

1. An apparatus for calibrating a magnetic sensor configured to generate an output signal indicative of magnetic field strength when an input signal is applied to the magnetic sensor, the apparatus comprising:
   a test magnetic field generator; and
   a processor configured to:
      control the test magnetic field generator to generate a first known magnetic field,
      control the magnetic sensor to generate a first test output signal when the test magnetic field generator generates the first known magnetic field and a first input signal is applied to the magnetic sensor,
      determine a first compensation value for the first input signal based on a deviation of the first test output signal from a first expected output signal, wherein the first expected output signal is indicative of magnetic field strength of the first known magnetic field, and
      determine a compensated input signal to be applied to the magnetic sensor, wherein the compensated input signal is based on the first compensation value.

2. The apparatus according to claim 1, wherein:
   controlling the magnetic sensor to generate the first test output signal includes controlling the magnetic sensor to generate the first test output signal when the magnetic sensor is at a first temperature,
   the processor is further configured to:
      control the test magnetic field generator to generate a second known magnetic field,
      control the magnetic sensor to generate a second test output signal when the test magnetic field generator generates the second known magnetic field and a second input signal is applied to the magnetic sensor, and when the magnetic sensor is at a second temperature, and
      determine a second compensation value for the second input signal based on a deviation of the second test output signal from a second expected output signal, wherein the second expected output signal is indicative of magnetic field strength of the second known magnetic field, and
   the compensated input signal is further based on the second compensation value, the first temperature, and the second temperature.

3. The apparatus according to claim 2, wherein the processor is further configured to:
   control the magnetic sensor to generate a measurement output signal when the compensated input signal is applied to the magnetic sensor.

4. The apparatus according to claim 3, wherein the compensated input signal is further based on a temperature of the magnetic sensor at a time when the magnetic sensor generates the measurement output signal.

5. The apparatus according to claim 4, wherein the compensated input signal is based on a function of the first compensation value and the second compensation value over a temperature range that includes the first temperature, the second temperature, and the temperature of the magnetic sensor at the time when the magnetic sensor generates the measurement output signal.

6. The apparatus according to claim 3, wherein the processor is further configured to determine a current through at least one wire based on the measurement output signal.

7. The apparatus according to claim 6, wherein:
   the apparatus further includes a housing that includes an opening for receiving the at least one wire, and
   the magnetic sensor is arranged in the housing.

8. The apparatus according to claim 7, wherein the housing is an at least partially flexible housing.

9. The apparatus according to claim 8, further comprising a flexible circuit board disposed within the at least partially flexible housing, wherein the magnetic sensor is disposed on the flexible circuit board.

10. The apparatus according to claim 1, wherein the magnetic sensor includes a plurality of magnetic sensing elements in a Wheatstone bridge configuration and the input signal is a bridge signal of the Wheatstone bridge.

11. The apparatus according to claim 1, wherein the input signal is based on at least one of:
   a proportional to absolute temperature signal,
   a complementary to absolute temperature signal, or
   a zero temperature coefficient absolute temperature signal.

12. The apparatus according to claim 1, wherein the magnetic sensor is a magnetoresistive sensor.

13. An apparatus for measuring current flow through at least one wire, the apparatus comprising:
   a housing comprising an opening for receiving the at least one wire;
   a magnetic sensor arranged within the housing;
   a test magnetic field generator configured to generate a magnetic field; and
   a processor,
   wherein the test magnetic field generator is configured to generate a known magnetic field, and the magnetic sensor is configured to, when a bias signal is applied to the magnetic sensor and the test magnetic field generator generates the known magnetic field, generate a test output signal indicative of a magnetic field strength, and
   wherein the processor is configured to:
      based on a deviation of the test output signal from an expected output signal, determine a compensation to be applied to the bias signal, where the expected output signal is indicative of an expected magnetic field strength of the known magnetic field, and
      derive a measure of a current in the at least one wire based on a measurement output signal generated by the magnetic sensor, where the magnetic sensor is configured to generate the measurement output signal when the bias signal with the compensation applied thereto is applied to the magnetic sensor and when the at least one wire extends through the opening of the housing.

14. The apparatus according to claim 13, wherein the magnetic sensor includes a plurality of magnetoresistive sensor elements arranged in a Wheatstone bridge configuration.

15. A method of operating an apparatus comprising a test magnetic field generator configured to generate known magnetic fields and further comprising a housing with an opening for receiving the at least one wire and a magnetic sensor arranged within the housing, the magnetic sensor configured to generate output signals indicative of magnetic field strengths of magnetic fields in a vicinity of the magnetic sensor, the method comprising:

controlling the test magnetic field generator to generate a first known magnetic field;

controlling the magnetic sensor to generate a first test output signal when the test magnetic field generator generates the first known magnetic field and a first bias signal is applied to the magnetic sensor;

based on a deviation of the first test output signal from a first expected output signal, determining a first compensated bias signal, where the first expected output signal is indicative of an expected magnetic field strength of the first known magnetic field when the first bias signal is applied to the magnetic sensor, and where the first compensated bias signal is the first bias signal compensated to reduce the deviation of the first test output signal from the first expected output signal;

controlling the magnetic sensor to generate a measurement output signal when a compensated bias signal is applied to the magnetic sensor and when the at least one wire extends through the opening of the housing, where the compensated bias signal is based on the first compensated bias signal; and deriving a measure of a current in the at least one wire based on the measurement output signal.

16. The method according to claim 15, wherein:

controlling the magnetic sensor to generate the first test output signal includes controlling the magnetic sensor to generate the first test output signal when the magnetic sensor is at a first temperature, the first expected output signal is indicative of the expected magnetic field strength of the first known magnetic field when the first bias signal is applied to the magnetic sensor and the magnetic sensor is at the first temperature, and the compensated bias signal is further based on the first temperature.

17. The method according to claim 16, further comprising:

controlling the test magnetic field generator to generate a second known magnetic field;

controlling the magnetic sensor to generate a second test output signal when the test magnetic field generator generates the second known magnetic field, a second bias signal is applied to the magnetic sensor, and the magnetic sensor is at a second temperature; and based on a deviation of the second test output signal from a second expected output signal, determining a second compensated bias signal, where the second expected output signal is indicative of an expected magnetic field strength of the second known magnetic field when the second bias signal is applied to the magnetic sensor and the magnetic sensor is at the second temperature, and when the second compensated bias signal is the second bias signal compensated to reduce the deviation of the second test output signal from the second expected output signal, wherein the compensated bias signal is further based on the second compensated bias signal and the second temperature.

18. The method according to claim 17, further comprising determining the compensated bias signal based on a temperature of the magnetic sensor when the magnetic sensor is to generate the measurement output and based on an interpolation and/or an extrapolation of the first compensated bias signal and the second compensated bias signal in relation to the first temperature and the second temperature.

19. The method according to claim 18, wherein determining the compensated bias signal includes determining a bias signal corresponding to the temperature of the magnetic sensor when the magnetic sensor is to generate the measurement output from a curve representing relationship between bias signals and temperatures, the curve generated based on the interpolation and/or the extrapolation of the first compensated bias signal and the second compensated bias signal in relation to the first temperature and the second temperature.

20. The method according to claim 17, further including storing in memory information indicative of:

the first temperature,
the first compensated bias signal,
the second temperature, and
the second compensated bias signal.

21. The apparatus according to claim 13, wherein:

the known magnetic field is a first known magnetic field,
the test output signal is a first test output signal,
the expected output signal is a first expected output signal,
the compensation is a first compensation,
the magnetic sensor is configured to generate the first test output signal when the magnetic sensor is at a first temperature,
the test magnetic field generator is configured to generate a second known magnetic field, and the magnetic sensor is configured to, when a second bias signal is applied to the magnetic sensor and the test magnetic field generator generates the second known magnetic field, generate a second test output signal,
the magnetic sensor is configured to generate the second test output signal when the magnetic sensor is at a second temperature,
the processor is configured to:
based on a deviation of the second test output signal from a second expected output signal, determine a second compensation to be applied to the bias signal, where the second expected output signal is indicative of an expected magnetic field strength of the second known magnetic field, and
derive the measure of the current in the at least one wire based on the measurement output signal generated by the magnetic sensor, where the magnetic sensor is configured to generate the measurement output signal when the bias signal with the first compensation and the second compensation applied thereto is applied to the magnetic sensor and when the at least one wire extends through the opening of the housing.

22. The apparatus according to claim 21, wherein the bias signal with the first compensation and the second compensation over a temperature range that includes the first temperature, the second temperature, and a temperature of the magnetic sensor at the time when the magnetic sensor generates the measurement output signal.

23. The apparatus according to claim 20, wherein the housing is an at least partially flexible housing.

24. The apparatus according to claim 20, wherein the magnetic sensor is a magnetoresistive sensor.

25. The apparatus according to claim 1, wherein the input signal is a bias signal.

\* \* \* \* \*